(12) United States Patent
Sato

(10) Patent No.: US 10,239,747 B2
(45) Date of Patent: Mar. 26, 2019

(54) SEMICONDUCTOR PRESSURE SENSOR

(71) Applicant: Mitsubishi Electric Corporation, Tokyo (JP)

(72) Inventor: Kimitoshi Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/430,813

(22) Filed: Feb. 13, 2017

(65) Prior Publication Data
US 2017/0349430 A1 Dec. 7, 2017

(30) Foreign Application Priority Data

Jun. 1, 2016 (JP) .................. 2016-109795

(51) Int. Cl.
*B81B 1/00* (2006.01)
*B81B 3/00* (2006.01)
*B81C 1/00* (2006.01)

(52) U.S. Cl.
CPC ........ *B81B 3/0072* (2013.01); *B81C 1/00666* (2013.01); *B81B 2201/0264* (2013.01); *B81B 2203/0127* (2013.01); *B81B 2203/0315* (2013.01); *B81B 2203/04* (2013.01); *B81C 2201/0167* (2013.01); *B81C 2201/0176* (2013.01)

(58) Field of Classification Search
None
See application file for complete search history.

(56) References Cited

U.S. PATENT DOCUMENTS

| | | |
|---|---|---|
| 5,064,165 A | 11/1991 | Jerman |
| 6,472,243 B2 | 10/2002 | Gogoi et al. |
| 6,631,645 B1 | 10/2003 | Satou et al. |
| 6,945,115 B1 | 9/2005 | Wang |
| 9,117,932 B2 | 8/2015 | Sato |
| 9,395,258 B2 | 7/2016 | Sato |

(Continued)

FOREIGN PATENT DOCUMENTS

| | | |
|---|---|---|
| DE | 102 06 711 A1 | 8/2003 |
| DE | 10 2004 061 796 A1 | 7/2006 |

(Continued)

OTHER PUBLICATIONS

DE Office Action dated Nov. 29, 2017, from corresponding DE Appl No. 10 2017 208 436.7, with English translation, 9 pp.

(Continued)

*Primary Examiner* — Reema Patel
(74) *Attorney, Agent, or Firm* — Studebaker & Brackett PC

(57) ABSTRACT

A semiconductor pressure sensor includes a fixed electrode placed at a principal surface of a semiconductor substrate, and a diaphragm movable through an air gap in a thickness direction of the semiconductor substrate at least in an area where the diaphragm is opposed to the fixed electrode. The diaphragm includes: a movable electrode; a first insulation film placed closer to the air gap with respect to the movable electrode; a second insulation film placed opposite to the air gap with respect to the movable electrode, the second insulation film being of a same film type as the first insulation film; and a shield film that sandwiches the second insulation film with the movable electrode.

6 Claims, 22 Drawing Sheets

(56) References Cited

U.S. PATENT DOCUMENTS

| | | |
|---|---|---|
| 2008/0257497 A1 | 10/2008 | Shimaoka et al. |
| 2011/0108932 A1 | 5/2011 | Benzel et al. |
| 2014/0159122 A1* | 6/2014 | Sato .................. H01L 27/0617 |
| | | 257/254 |
| 2015/0061049 A1 | 3/2015 | Weber |
| 2016/0272487 A1 | 9/2016 | Sato |

FOREIGN PATENT DOCUMENTS

| | | |
|---|---|---|
| DE | 10 2013 217 726 A1 | 3/2015 |
| JP | H04-506253 A | 10/1992 |
| JP | H08-335707 A | 12/1996 |
| JP | H11-281509 A | 10/1999 |
| JP | 2001-235381 A | 8/2001 |
| JP | 3310216 B2 | 8/2002 |
| JP | 3359871 B2 | 12/2002 |
| JP | 2007-274096 A | 10/2007 |
| JP | 4267322 B2 | 5/2009 |
| JP | 2014-115153 A | 6/2014 |
| JP | 5933480 B2 | 6/2016 |
| JP | 2016-176755 A | 10/2016 |

OTHER PUBLICATIONS

An Office Action mailed by the Japanese Patent Office dated Feb. 12, 2019, which corresponds to Japanese Patent Application No. 2016-109795 and is related to U.S. Appl. No. 15/430,813; with English translation.

* cited by examiner

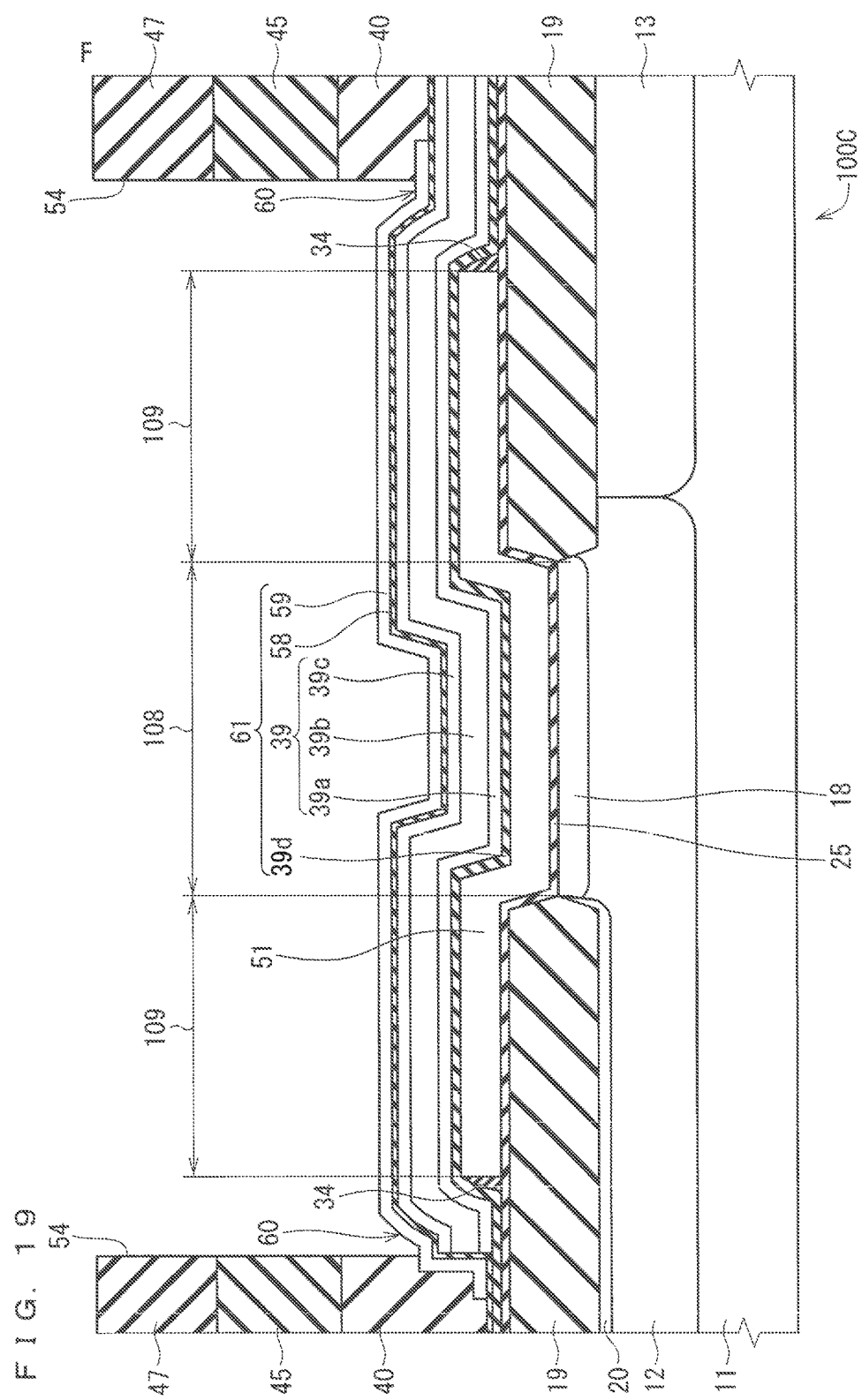
F I G. 19

SEMICONDUCTOR PRESSURE SENSOR

BACKGROUND OF THE INVENTION

Field of the Invention

The present invention relates to a semiconductor pressure sensor and a method for manufacturing the same. The semiconductor pressure sensor is suitable for being integrated with a circuit (hereinafter referred to as "MOS circuit") including a field effect transistor having a MOS structure (hereinafter referred to as "MOS transistor").

The term "MOS" has been used for laminated structures of a metal, an oxide, and a semiconductor since the old days, and is an acronym for "metal-oxide-semiconductor". Particularly, MOS transistors have been improved in its materials of gate insulation films or gate electrodes in view of the recent integration and improvement in the manufacturing processes.

The MOS transistors have adopted, for example, polysilicon instead of metals as a material of the gate electrodes to form mainly self-aligned sources and drains. Furthermore, although materials with a higher dielectric constant are used as the materials of the gate insulation films to improve the electric characteristics, the materials are not necessarily limited to oxides.

Thus, the term "MOS" is not necessarily used only for the laminated structures of a metal, an oxide, and a semiconductor, and the Specification is not predicated on such a limitation. In other words, in view of the technical knowledge, "MOS" is not only an abbreviation derived from its etymology but also widely contains the meaning of laminated structures of a conductor, an insulator, and a semiconductor.

In recent years, the semiconductor pressure sensors have been used in various fields including vehicles. The semiconductor pressure sensors are integrated with a MOS circuit as disclosed by, for example, Japanese Patent No. 4267322 (hereinafter referred to as Patent Document 1).

In the semiconductor pressure sensor disclosed by Patent Document 1, a MOS area in which a MOS circuit is to be formed and a pressure sensor area in which a pressure sensor is to be formed are defined in a semiconductor substrate.

In the MOS area, a MOS circuit including an n-channel type MOS transistor and a p-channel type MOS transistor is formed. In the pressure sensor area, a capacitive semiconductor pressure sensor is formed.

Similarly as the semiconductor pressure sensor disclosed by Patent Document 1, a capacitive semiconductor pressure sensor is formed in each of the semiconductor pressure sensors disclosed by Japanese Patent No. 3359871 and Japanese Patent No. 3310216 (hereinafter referred to as Patent Document 2 and Patent Document 3, respectively).

In such a capacitive semiconductor pressure sensor, a fixed electrode and a movable electrode are formed, and a vacuum chamber is provided between the fixed electrode and the movable electrode. The vacuum chamber is sealed with a sealing film. A distance between the fixed electrode and the movable electrode varies according to the surrounding pressure, and is detected as a value of an electrostatic capacitance (hereinafter "capacitance") between the fixed electrode and the movable electrode. The pressure is measured on the basis of variation in the capacitance.

The movable electrode has an internal stress because it is formed by depositing, for example, polysilicon using semiconductor processes. Examples of reducing the internal stress of polysilicon to be formed as the movable electrode include performing a high-temperature thermal treatment. The semiconductor pressure sensor integrated with a MOS circuit has difficulty in applying such a method.

Thus, Patent Document 1 proposes a technique for simultaneously performing a high-temperature thermal treatment on a diaphragm that is a movable electrode and annealing for activating a source and a drain of a CMOS transistor.

As described in Patent Document 2, when the internal stress is a compressive stress, a movable electrode sometimes buckles to show a convex shape opposite to a vacuum chamber. Such a convex shape of the movable electrode destabilizes the characteristics of the semiconductor pressure sensor.

Thus, Patent Document 2 proposes a technique for stress control on a movable electrode by forming, for example, a thick portion having a compressive stress on the periphery of the movable electrode or a film with a tensile internal stress at the center of the movable electrode to prevent the movable electrode from showing a convex shape opposite to a vacuum chamber.

As such, omitting a high-temperature thermal treatment for stress control on a movable electrode is suitable for monolithic integration with MOS circuits formed by micromachining.

As described in Patent Document 3, when an object to be measured is in contact with a movable electrode in measuring the pressure, a charged material is sometimes attracted to the movable electrode. The charged material may cause the potential of the movable electrode to fluctuate, and consequently destabilize the output of the semiconductor pressure sensor.

Thus, Patent Document 3 proposes a technique for forming a grounded conductive film for electromagnetic shielding on a surface of the movable electrode through an insulation film, using conductive polysilicon. This makes the semiconductor pressure sensor more reliable.

Japanese Patent Application Laid-Open No. 2014-115153 (hereinafter referred to as Patent Document 4) and Japanese Patent Application Laid-Open No. 2007-274096, Japanese Patent Application Laid-Open No. H11-281509, and Japanese Patent Application Laid-Open H08-335707 are cited as the other prior art references relating to the present application.

The technique proposed by Patent Document 1 uses a low-stress nitride film as a layer under the polysilicon film with a compressive stress. Since a diaphragm is easily deflected subject to change in a temperature owing to difference in coefficient of linear thermal expansion between the polysilicon film and the nitride film, relieving stresses in the diaphragm by annealing for activating a source and a drain of a CMOS transistor is not preferable.

Furthermore, the diaphragm has a convex shape downward due to the compressive stress of the polysilicon film and the tensile stress of the nitride film under the polysilicon film. The convex shape has a disadvantage of being subject to manufacturing variability in each of the films.

The technique proposed by Patent Document 2 requires forming a film controlled by the compressive stress or the tensile stress partly in an area of the movable electrode, and thus requires adding processes of forming such a film in which the stress is controlled and patterning the film through photolithography. Such additional processes increase and complicate the manufacturing processes as a whole, which is not preferable.

In the technique proposed by Patent Document 3, an insulation film is formed only for a portion of the movable electrode at which the conductive film for electromagnetic shielding is formed. This shows adoption of a laminated structure of films with different coefficients of thermal expansion. Such adoption increases and complicates the dependence of the deflection of the movable electrode on a temperature. Thus, changes in the deflection of the movable electrode subject to change in an applied pressure should be separated from changes in the deflection of the movable electrode subject to change in the temperature. However, such separation requires complicated correction.

A circuit for such correction can be integrated with a MOS circuit. However, adding the circuit for correction increases the circuit scale and the size of a chip including the circuit, which is not preferable.

SUMMARY OF THE INVENTION

The present invention has been conceived from such viewpoints, and has an object of providing a semiconductor pressure sensor that does not require any thermal treatment for controlling a stress and that is more reliable.

The semiconductor pressure sensor according to an aspect of the present invention includes a fixed electrode placed at a principal surface of a semiconductor substrate, and a diaphragm movable through an air gap in a thickness direction of the semiconductor substrate at least in an area where the diaphragm is opposed to the fixed electrode. The diaphragm includes: a movable electrode; a first insulation film placed closer to the air gap with respect to the movable electrode; a second insulation film placed opposite to the air gap with respect to the movable electrode, the second insulation film being of a same film type as the first insulation film; and a shield film that sandwiches the second insulation film with the movable electrode.

The semiconductor pressure sensor according to the present invention does not require any thermal treatment for controlling a stress, and is more reliable.

These and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a cross-sectional view illustrating a structure of a semiconductor pressure sensor according to Embodiment 3;

DESCRIPTION OF THE PREFERRED EMBODIMENTS

Embodiments will be described hereinafter with reference to the accompanying drawings.

Embodiment 1

Figure 1:
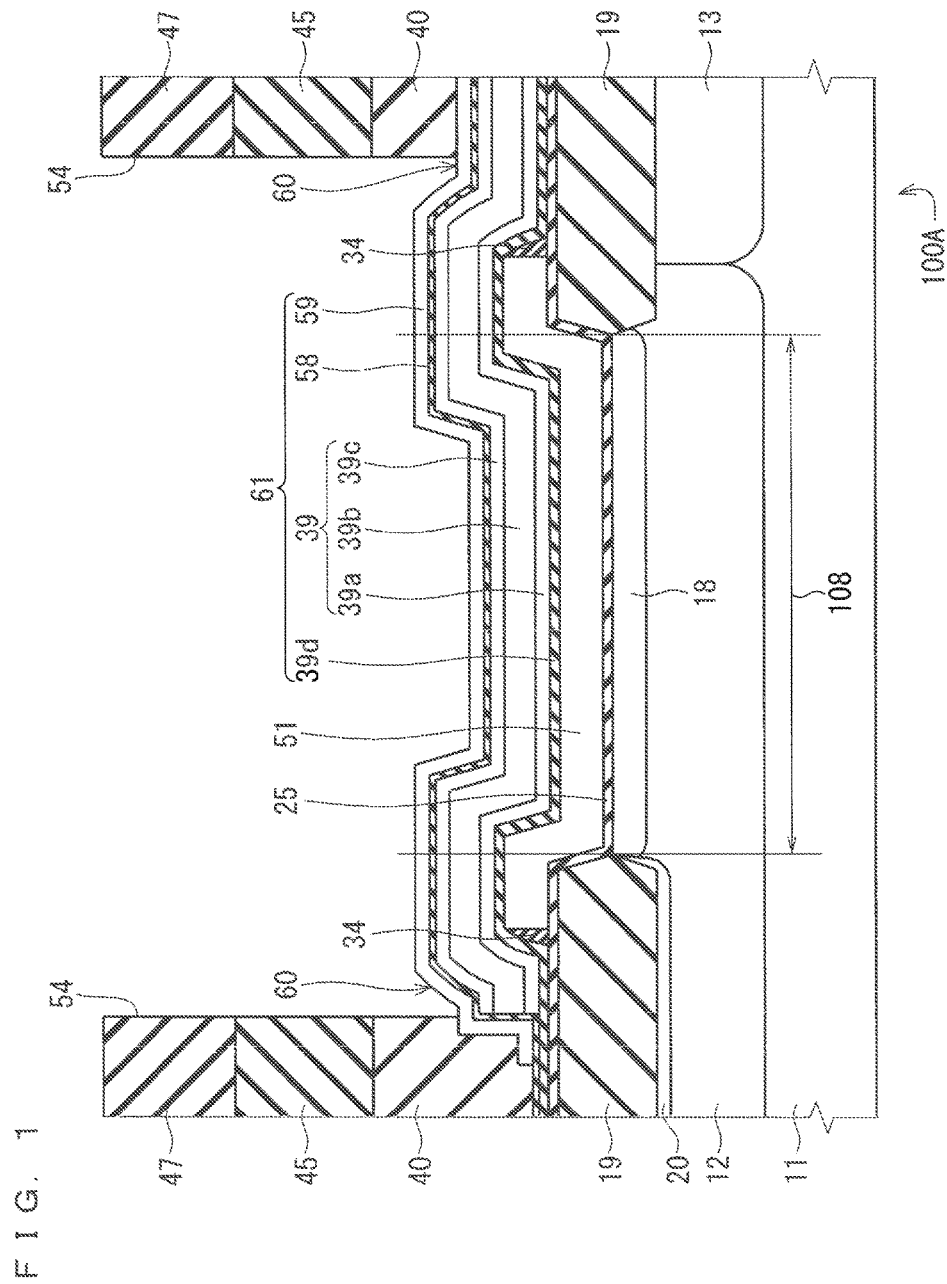
FIGS. 1 and 2 are cross-sectional views each illustrating a structure of a semiconductor pressure sensor according to Embodiment 1.
Figure 2:
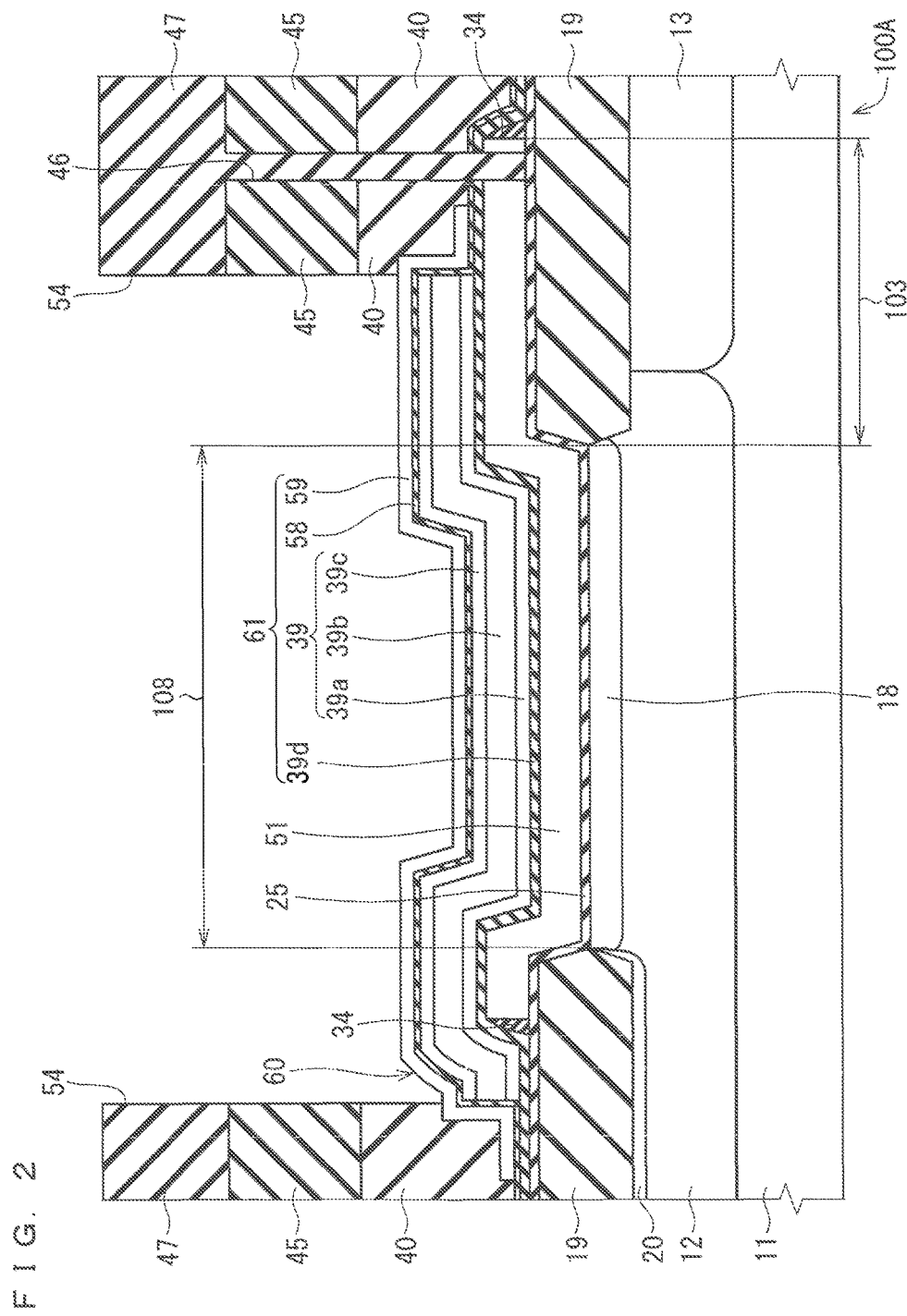
Figure 3:
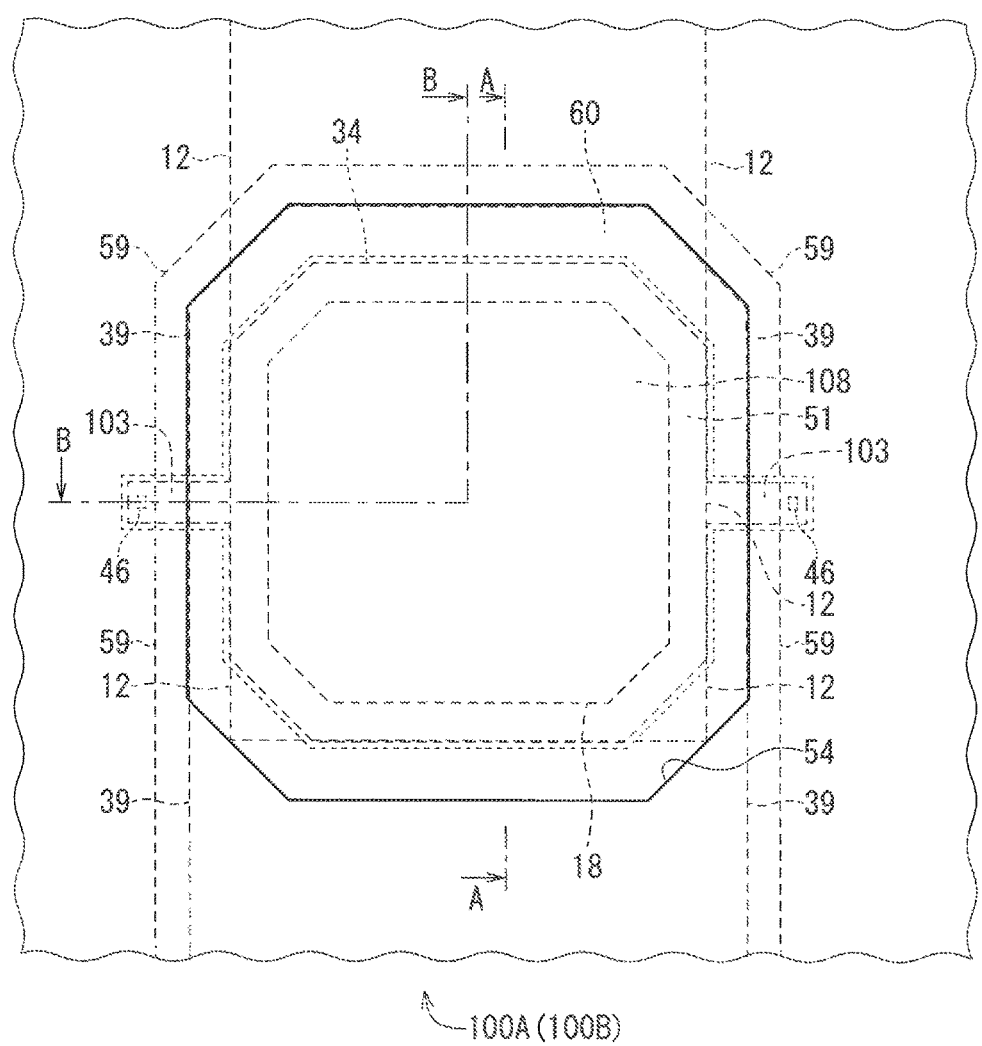
FIG. 3 is a plan view illustrating the structure of the semiconductor pressure sensor according to Embodiment 1.

FIGS. 1 and 2 are cross-sectional views each illustrating a structure of a semiconductor pressure sensor 100A according to Embodiment 1. FIG. 3 is a plan view illustrating the structure of the semiconductor pressure sensor 100A. In FIG. 3, the line AA corresponds to the cross-section of FIG. 1, and the lines BB correspond to the cross-section of FIG. 2. Note that "(100B)" added next to the reference numeral "100A" in FIG. 3 indicates that FIG. 3 will be used as a plan view of a semiconductor pressure sensor 100B according to Embodiment 2 to be described later but there is no other meaning.

The semiconductor pressure sensor 100A is formed on a semiconductor substrate 11. The technique for forming a CMOS circuit on the semiconductor substrate 11 is detailed in, for example, Patent Document 4. Thus, the description herein will be omitted. The semiconductor substrate 11 is, for example, a silicon substrate.

The semiconductor pressure sensor 100A is formed on a principal surface of the semiconductor substrate 11. In FIGS. 1 and 2, the principal surface is opposite to the surface existing under the semiconductor substrate 11.

The semiconductor pressure sensor 100A includes a fixed electrode 18 and a diaphragm 61. The fixed electrode 18 is placed at the principal surface of the semiconductor substrate 11. The diaphragm 61 is opposed to at least the fixed electrode 18 through an air gap 51 and is movable in a thickness direction of the semiconductor substrate 11 (hereinafter simply referred to as "thickness direction").

On the surface of the semiconductor substrate 11, a first well area 12 and a second well area 13 are formed. The first well area 12 and the second well area 13 differ in conductivity type. For example, if the first well area 12 is of p-type, the second well area 13 is of n-type.

The fixed electrode 18 is formed in the surface of the first well area 12, and has the same conductivity type as that of the first well area 12. The fixed electrode 18 is materialized as an impurity diffusion layer whose impurity concentration is higher than that of the first well area 12 serving as a conductor. An insulation film 19 is formed at the principal surface of the semiconductor substrate 11 to surround the fixed electrode 18. A generally-called field oxide film can serve as the insulation film 19.

A part of the insulation film 19 placed on the first well area 12 and the first well area 12 sandwich a diffusion layer 20. The diffusion layer 20 has the same conductivity type as that of the first well area 12, is higher in impurity concentration than the first well area 12, and functions as a conductor. The diffusion layer 20 is in contact with the fixed electrode 18 and functions as a generally-called diffused lead. The first well area 12 may also be regarded as the diffused lead.

The first well area 12, the second well area 13, the field oxide film, and the impurity diffusion layer functioning as a conductor that are placed at the semiconductor substrate 11 are known in the techniques for forming, for example, CMOS circuits.

The fixed electrode 18 and the insulation film 19 are covered with a protective film 25. Although the protective film 25 has a function of protecting the fixed electrode 18 from etching in forming the air gap 51, it does not serve any function relating to operations of the semiconductor pressure sensor 100A. Furthermore, the protective film 25 does not necessarily need to cover the insulation film 19.

The diaphragm 61 includes a movable electrode 39, a first insulation film 39d, a second insulation film 58, and a conductive shield film 59. The first insulation film 39d and the second insulation film 58 are of the same film type, and are, for example, oxide films made of tetraethyl orthosilicate (TEOS)-based glass. The movable electrode 39 and the conductive shield film 59 are formed of, for example, conductive polysilicon.

The first insulation film 39d is closer to the air gap 51 whereas the second insulation film 58 is opposite to the air gap 51, with respect to the movable electrode 39. The shield film 59 and the movable electrode 39 sandwich the second insulation film 58. The potential of the shield film 59 is fixed, for example, at a ground potential.

Portions of the first insulation film 39d and the second insulation film 58 that are included in the diaphragm 61 sandwich the movable electrode 39. In other words, the diaphragm 61 does not include an extension portion of the first insulation film 39d and the second insulation film 58 that do not sandwich the movable electrode 39.

The second insulation film 58 has a function of insulating the shield film 59 from the movable electrode 39. Such a laminated structure of the movable electrode 39, the second insulation film 58, and the shield film 59 is known by, for example, Patent Document 3. Thus, the further detailed description will be omitted.

Note that even when a charged material is attracted to the diaphragm 61, the output of the semiconductor pressure sensor 100A is not destabilized with the function of the shield film 59 similarly as the advantage described in Patent Document 3. Specifically, the second insulation film 58 and the shield film 59 can prevent the influence of the charged material and moisture attracted to the diaphragm 61 and external noise on the semiconductor pressure sensor 100A.

Lines and electrodes are formed to conduct electricity between an external device of the semiconductor pressure sensor 100A and each of the fixed electrode 18 and the movable electrode 39. A line for grounding the shield film 59, for example, a line for connecting the shield film 59 with the semiconductor substrate 11 is also formed. The conduction with the external device and grounding using these lines and electrodes are known by, for example, Patent Documents 3 and 4. Thus, the illustration and the detailed description will be omitted.

The movable electrode 39 establishes, between the fixed electrode 18 and itself, a capacitance used for detecting a pressure to be applied to the semiconductor pressure sensor 100A. The air gap 51 is in a vacuum, and the diaphragm 61 is deflected in proportion to an applied absolute pressure. Change in amount of deflection corresponding to change in pressure applied to the diaphragm 61 changes a distance between the fixed electrode 18 and the movable electrode 39. Thus, the applied absolute pressure is detected as change in the capacitance.

Differences in internal stress between the second insulation film 58 and the shield film 59 and between the second insulation film 58 and the movable electrode 39 induce a gradient of the internal stresses of the diaphragm 61 in a thickness direction (hereinafter simply referred to as "stress gradient"). Differences in coefficient of linear thermal expansion between the second insulation film 58 and the shield film 59 and between the second insulation film 58 and the movable electrode 39 increase the dependence of displacement of the diaphragm 61 on a temperature. The stress gradient and the dependence on the temperature of the diaphragm 61 are factors influencing the displacement of the movable electrode 39, other than the applied pressure. The factors cause an offset in the capacitance, or make the offset further dependent on a temperature.

However, the first insulation film 39d is opposite to the second insulation film 58 with respect to the movable electrode 39. Thus, the first insulation film 39d reduces the influence of the thermal expansion and the internal stress of the second insulation film 58 over the whole diaphragm 61. Such an advantage can be obtained irrespective of a material of the movable electrode 39.

As described above, the second insulation film 58 and the first insulation film 39d are of the same film type. It is further preferred to form the insulation films 58 and 39d under the same forming conditions and yet further with the same thickness. The first insulation film 39d also has a function of protecting the movable electrode 39 from the etching in forming the air gap 51. Thus, it is preferred to match the thickness of the second insulation film 58 with the thickness of the first insulation film 39d not when formed but after the etching. The etching will be described later.

As such, not only the second insulation film 58 and the shield film 59 can increase the reliability against causes of error including attraction of a charged material and moisture and the external noise but also the first insulation film 39d can increase the reliability against causes of error including the stress gradient of the diaphragm 61 and the dependence of displacement of the diaphragm 61 on the temperature.

The diaphragm 61 has, at its ends in the cross-sectional view, a fixed portion 60 that is fixed to the insulation film 19 from the opposite side of the semiconductor substrate 11. Since the capacitance generated between the fixed portion 60 and the fixed electrode 18 is independent of variation in the pressure, the capacitance is regarded as a parasitic capacitance relative to the capacitance of the semiconductor pressure sensor 100A. The fixed portion 60 is preferably fixed to the insulation film 19 surrounding the fixed electrode 18 to reduce this parasitic capacitance.

The semiconductor pressure sensor 100A includes a sidewall 34. The sidewall 34 is placed above the insulation film 19, and has a surface adjacent to the fixed portion 60. The adjacent surface is a curved surface that is closer to the air gap 51 as it is more distant from the insulation film 19. Thus, the fixed portion 60 of the diaphragm 61 is curved shape in the cross-section. Such a shape of the fixed portion 60 is preferable to avoid the concentration of the stress in the fixed portion 60 when a pressure is applied to the diaphragm 61.

A first interlayer insulation film 40 and a second interlayer insulation film 45 are used to be connected to a line, in a process of routing an electrode of another circuit produced in parallel with the semiconductor pressure sensor 100A, for example, a CMOS circuit. Since the process is a known technique as disclosed by, for example, Patent Document 4, it will be simply described later but the detailed description will be omitted. The second interlayer insulation film 45 is placed opposite to (above in FIGS. 1 and 2) the semiconductor substrate 11 with respect to the first interlayer insulation film 40.

A sealing film 47 is placed opposite to the semiconductor substrate 11 with respect to the second interlayer insulation film 45. As illustrated in the cross-section of the lines BB of FIG. 2, an etching hole 46 pieces through the first interlayer insulation film 40, the second interlayer insulation film 45, the first insulation film 39d, and the second insulation film 58, and communicates with the air gap 51.

The sealing film 47 reaches the etching hole 46, and the air gap 51 at the position communicating with the etching hole 46, and contributes to sealing the air gap 51 at the etching hole 46. Since the etching hole 46 contributes to a process of forming the air gap 51 and the process is a known technique as disclosed by, for example, Patent Document 4, the process will be simply described later but the detailed description will be omitted.

The first interlayer insulation film 40, the second interlayer insulation film 45, and the sealing film 47 cover the surrounding of the diaphragm 61. The first interlayer insulation film 40, the second interlayer insulation film 45, and the sealing film 47 are opened with an opening 54 that exposes at least an area 108. The area 108 is an area opposed to the fixed electrode 18 in an area where the air gap 51 exists. With exposure of the area 108 through the opening 54, the mobility of a portion of the diaphragm 61 opposed to the fixed electrode 18 is ensured and change in the capacitance largely reflecting the pressure is detected with higher precision.

The opening 54 preferably further exposes the surrounding of the area 108, for example, a portion of the diaphragm 61 opposed to the insulation film 19, which ensures the mobility of the diaphragm 61 around the area 108, increases the displacement of the diaphragm 61 in the area 108, and enables the pressure to be detected with higher precision.

An area 103 is an area surrounding the area 108 in the area where the air gap 51 exists, and an area communicating with the etching hole 46. Thus, at least an area where the etching hole 46 is open in the area 103 is covered with the first interlayer insulation film 40, the second interlayer insulation film 45, and the sealing film 47.

Embodiment 1 exemplifies a case where the movable electrode 39 includes a first polysilicon layer 39a, a second polysilicon layer 39b, and a third polysilicon layer 39c that are laminated in a thickness direction in a stated order from the fixed electrode 18. Furthermore, Embodiment 1 exemplifies a case where the shield film 59 is a fourth polysilicon layer. All of these polysilicon layers have conductivity.

It is preferred that respective directions of the internal stresses in the first polysilicon layer 39a, the third polysilicon layer 39c, and the shield film 59 are the same, and are opposite to the direction of the internal stress in the second polysilicon layer 39b. In contrast to a case where the movable electrode 39 is composed of a single polysilicon layer, such a structure reduces the internal stress or the stress gradient of the diaphragm 61 and increases the reliability of the displacement of the diaphragm 61 or the displacement of the movable electrode 39 to be used for detecting a pressure.

Figure 4:
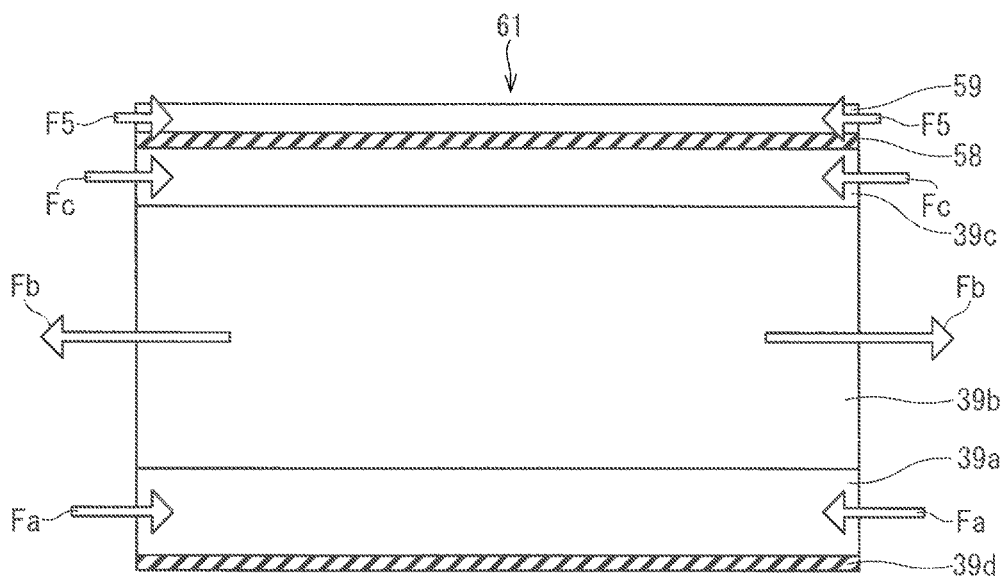
FIGS. 4 and 5 are cross-sectional views each schematically illustrating a structure of a diaphragm.
Figure 5:
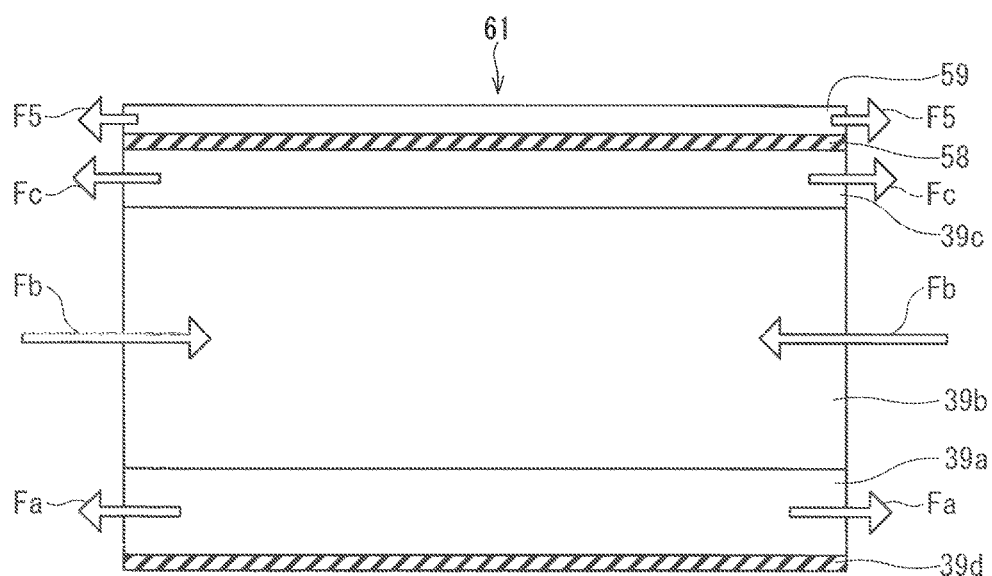

FIGS. 4 and 5 are cross-sectional views each schematically illustrating a structure of the diaphragm 61. In FIG. 4, the first polysilicon layer 39a, the third polysilicon layer 39c, and the shield film 59 have compressive internal stresses Fa, Fc, and F5, respectively, whereas the second polysilicon layer 39b has a tensile internal stress Fb. In FIG. 5, the first polysilicon layer 39a, the third polysilicon layer 39c, and the shield film 59 have tensile internal stresses Fa, Fc, and F5, respectively, whereas the second polysilicon layer 39b has a compressive internal stress Fb.

In both FIGS. 4 and 5, these internal stresses are each indicated by a block arrow whose length indicates the magnitude thereof. Since the magnitude of an internal stress generally occurring is greater as the layer is thicker, lengths of the drawn arrows have the same tendency in FIGS. 4 and 5.

For example, the first polysilicon layer 39a, the third polysilicon layer 39c, and the shield film 59 are formed under the same forming conditions. Thus, the internal stresses occurring in these layers are identical in direction, that is, either compressive or tensile, and have the same magnitude per unit thickness.

With respect to the second polysilicon layer 39b, the first polysilicon layer 39a is opposite to the third polysilicon layer 39c and the shield film 59. Thus, equating a thickness of the first polysilicon layer 39a with a sum of thicknesses of the third polysilicon layer 39c and the shield film 59 can balance the stress gradient of the whole diaphragm 61. This is preferable for almost eliminating the amount of deflection of the diaphragm 61 when no load is applied.

Not only the stress gradient but also the internal stresses can be reduced in the whole diaphragm 61. For example, when the internal stresses per unit thickness of the first polysilicon layer 39a, the second polysilicon layer 39b, the third polysilicon layer 39c, and the shield film 59 are identical, equating a sum of thicknesses of the first polysilicon layer 39a, the third polysilicon layer 39c, and the shield film 59 with a thickness of the second polysilicon layer 39b balances all the internal stresses of the whole diaphragm 61.

The internal stress in each of the polysilicon layers is influenced by the manufacturing process. However, as the layer is thicker, the magnitude of the internal stress occurring is greater. Thus, in the diaphragm 61 having the aforementioned structure though including the shield film 59, the stress gradient or the internal stress itself of the whole diaphragm 61 can be reduced simply by adjusting the thicknesses of the polysilicon layers without adding a high-temperature thermal treatment or requiring any complicated processes. This is preferable for easily obtaining the semiconductor pressure sensor 100A with higher reliability and precision.

The stress gradient can be actively used by, in the structure illustrated in FIG. 4, reducing the thickness of the first polysilicon layer 39a more than a sum of the thicknesses of the third polysilicon layer 39c and the shield film 59 or in the structure illustrated in FIG. 5, increasing the thickness of the first polysilicon layer 39a more than a sum of the thicknesses of the third polysilicon layer 39c and the shield film 59. With such adjustment of the thicknesses, the diaphragm 61 has a stress gradient, and a bending moment swelling toward the semiconductor substrate 11. This is suitable when it is desired to have the diaphragm 61 swelling toward the semiconductor substrate 11 with no load applied, as proposed by Patent Document 2.

In other words, the dependence of the displacement of the diaphragm 61 or the displacement of the movable electrode 39 on the stress can be controlled by adjusting the thickness of each of the polysilicon layers.

The description with reference to FIGS. 4 and 5 disregards the internal stresses in the first insulation film 39d and the second insulation film 58. This is because each of the first insulation film 39d and the second insulation film 58 is thinner than the first polysilicon layer 39a, the second polysilicon layer 39b, the third polysilicon layer 39c, and the shield film 59 that is a fourth polysilicon layer. In other words, the first polysilicon layer 39a, the second polysilicon layer 39b, the third polysilicon layer 39c, and the shield film 59 can play certain roles in balancing the stresses of the whole diaphragm 61 and reducing the stress gradient thereof.

However, it is preferred to provide the first insulation film 39d to reduce the dependence of displacement of the diaphragm 61 on a temperature that is caused by the differences in coefficient of linear thermal expansion between the second insulation film 58 and each of the polysilicon layers as described above.

Considering the internal stresses in the first insulation film 39d and the second insulation film 58 as judgment criteria, the structure illustrated in FIG. 4 or FIG. 5 may be chosen.

A method for manufacturing the semiconductor pressure sensor 100A with such a structure will be described hereinafter with reference to FIGS. 6 to 13. FIGS. 6 to 10 are cross-sectional views corresponding to the line AA in FIG. 3, and FIGS. 11 to 13 are cross-sectional views corresponding to the lines BB in FIG. 3.

Figure 6:
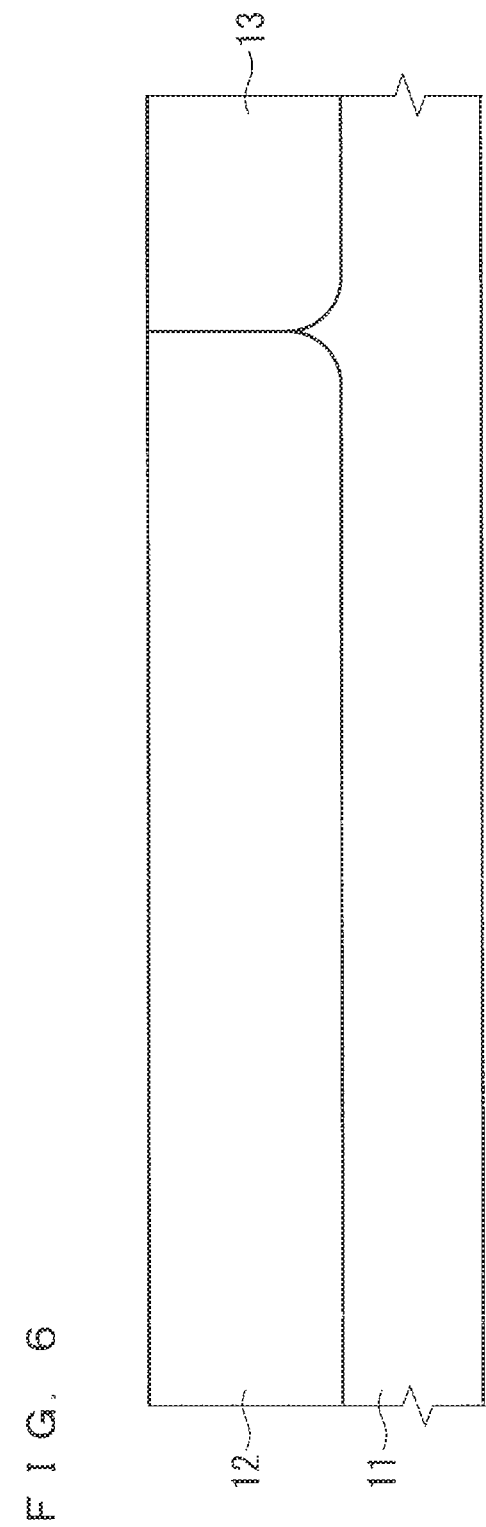
FIGS. 6 to 13 are cross-sectional views each describing a method for manufacturing the semiconductor pressure sensor according to Embodiment 1.

First, FIG. 6 is referred to. The first well area 12 and the second well area 13 are formed on the principal surface of the semiconductor substrate 11 by a method known in CMOS processes. Specifically, the processes include implantation of impurities and thermal diffusion. Types of the impurities to be implanted into the first well area 12 and the second well area 13 are chosen to differ in respective conductivity types.

Figure 7:
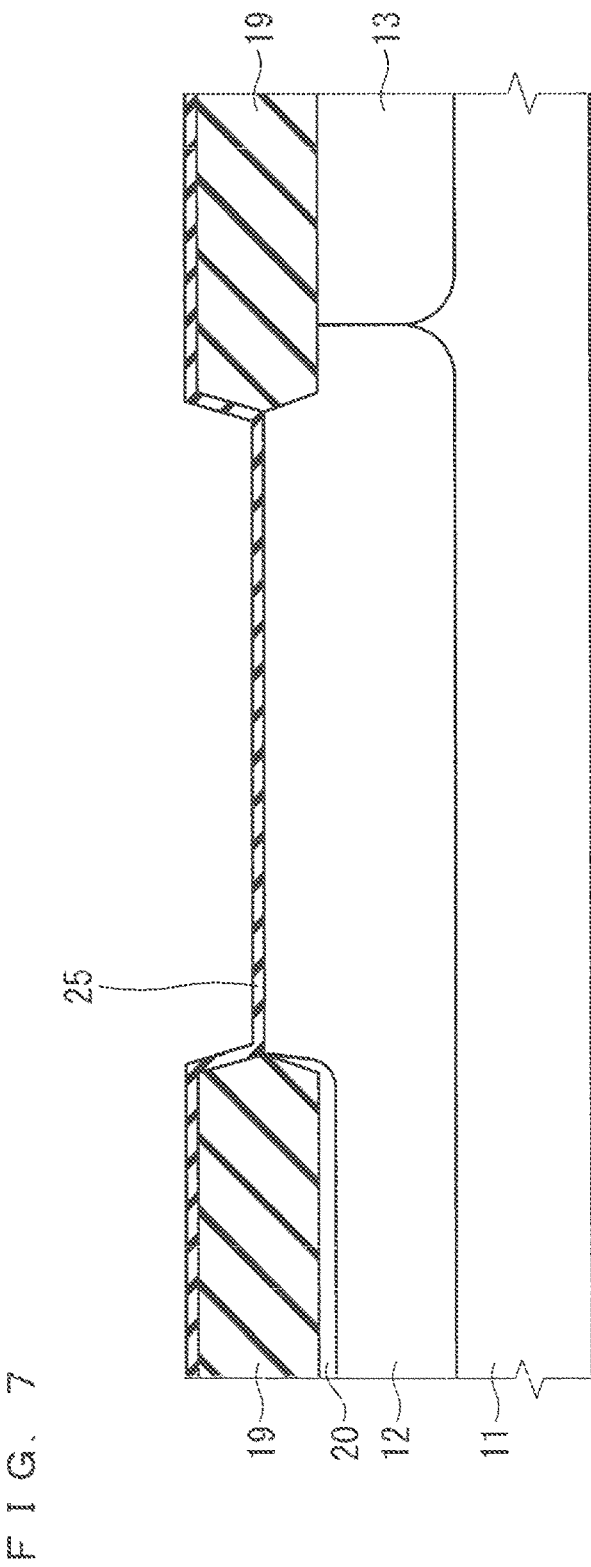

Next, FIG. 7 is referred to. The insulation film 19 is formed as a field oxide film using, for example, a local oxidation of silicon (LOCOS) process that is known in CMOS processes. The insulation film 19 has a thickness of approximately 0.2 to 1.0 μm. The insulation film 19 covers the second well area 13, and partly exposes the first well area 12.

Since the LOCOS process is a known technique, the description thereof is simplified. First, an underlying oxide film, a polysilicon film, and a silicon nitride film (all not illustrated) are laminated in this order on the principal surface of the semiconductor substrate 11. With application of predetermined photolithography and etching to the laminated films, a part of the silicon nitride film corresponding to an area where the insulation film 19 is to be formed is removed.

Subsequently, with application of photolithography again, impurities are implanted into an area where the diffusion layer 20 is to be formed on a part of the principal surface of the first well area 12, using a resist mask (not illustrated) as an implantation mask. The impurities have the same conductivity type as that of the first well area 12.

Then, the resist mask is removed. Next, the polysilicon film corresponding to the area where the silicon nitride film is removed is locally oxidized by oxidation under predetermined conditions to form the insulation film 19. Then, the remaining silicon nitride film is removed.

During the oxidation for forming the insulation film 19, the impurities implanted into the area where the diffusion layer 20 is to be formed are activated to form the diffusion layer 20. The diffusion layer 20 immediately under the insulation film 19 contributes to reduction in the resistance of the diffused lead portion for the fixed electrode 18 in the semiconductor pressure sensor 100A.

Next, the insulating protective film 25 is formed above the semiconductor substrate 11 by, for example, thermal oxidation. The protective film 25 is formed using processes of forming a gate oxide film that are known in CMOS processes.

Figure 8:
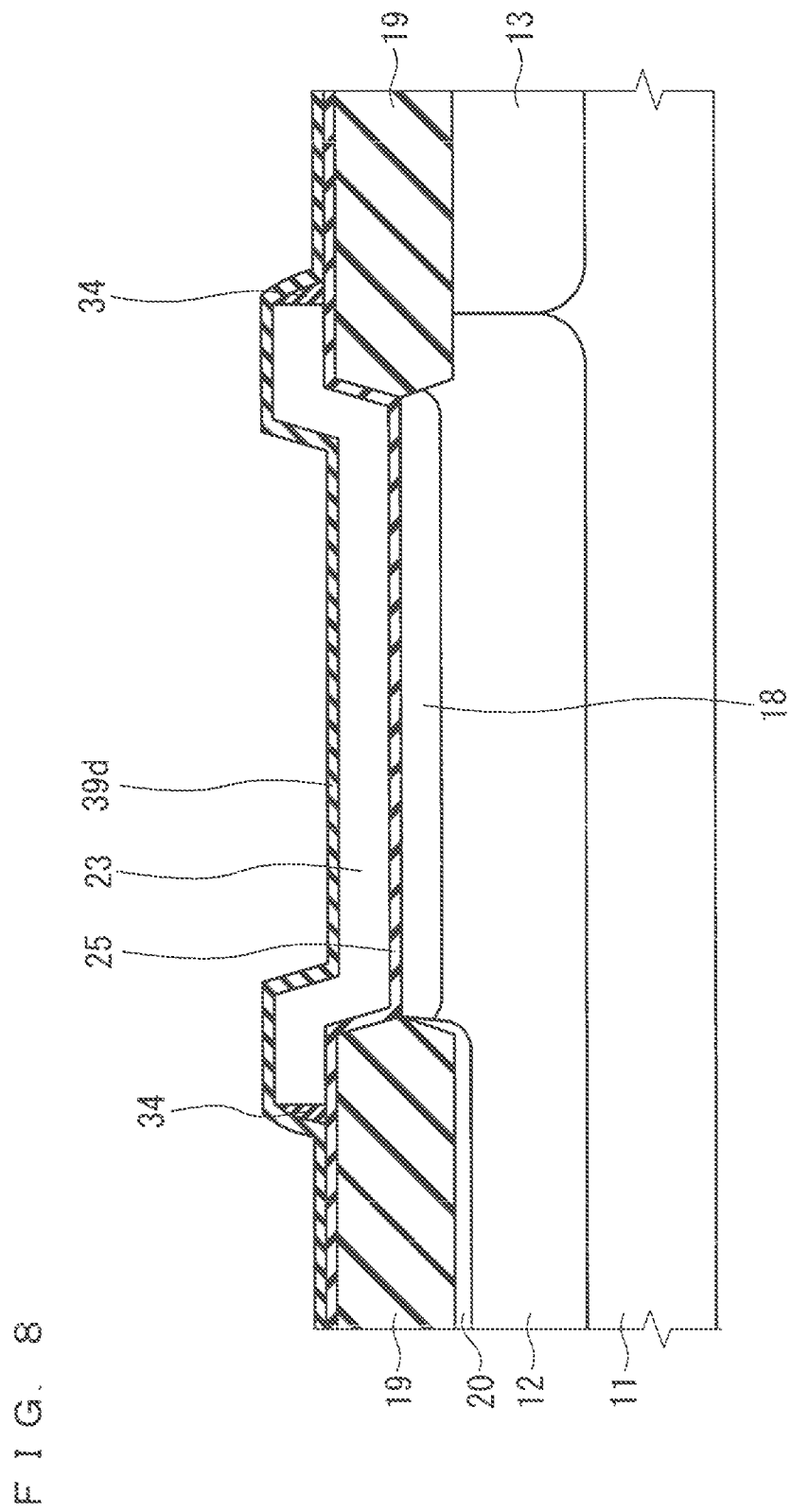

Next, FIG. 8 is referred to. The first well area 12 in the area surrounded by the insulation film 19, into which impurities of the same conductivity type as that of the first well area 12 are implanted through the protective film 25, is then thermally diffused to form the fixed electrode 18. The impurities can be implanted using a known technique, for example, using a resist mask (not illustrated) as an implantation mask.

Next, a sacrificial film 23 is formed to cover the protective film 25. The sacrificial film 23 is, for example, formed of a polycide film or simply of a polysilicon film using the processes of forming a gate electrode that are known in CMOS processes.

Since the sacrificial film 23 is removed and does not remain in the semiconductor pressure sensor 100A as will be described later, the conductivity thereof is not essential. Since the sacrificial film 23 is formed using the processes of forming a gate electrode, the description herein is based on the sacrificial film 23 with conductivity.

The polycide film includes, for example, a polysilicon film with a thickness of approximately 50 to 300 nm and a tungsten silicide ($WSi_2$) film with a thickness of approximately 50 to 300 nm. The polysilicon film is formed by chemical vapor deposition (CVD) with phosphorus introduced during or immediately after the formation to obtain an n-type polysilicon film. The tungsten silicide film is formed by sputtering or CVD so as to cover the polysilicon film.

The polycide film formed in such a manner is shaped by etching to form the sacrificial film 23. The sacrificial film 23 covers at least the fixed electrode 18 and overlies the insulation film 19 around the fixed electrode 18. Such a shaping can be performed by a known etching process using, as an etching mask, a resist mask (not illustrated) obtained with application of known photolithography.

Next, the sidewall 34 is formed on the side surface of the sacrificial film 23. The sidewall 34 is insulated from the fixed electrode 18 by the protective film 25, and from the movable electrode 39 by the first insulation film 39d. Thus, it does not basically matter whether the material of the sidewall 34 has conductivity or is insulating when the sidewall 34 is used in the semiconductor pressure sensor 100A.

The sidewall 34 can be formed using a process of forming a sidewall next to a gate electrode that is known in CMOS processes. Here, examples of the process of forming the sidewall 34 include processes of forming a film covering the sacrificial film 23, for example, a TEOS-based oxide film and applying anisotropic dry etching to the resulting structure.

Furthermore, such dry etching is suitable for forming a curve that is closer to the air gap 51 as it is more distant from the insulation film 19 to be opposite to the air gap 51 with respect to the sidewall 34. The curve reduces step height around the sacrificial film 23, which contributes to forming the first insulation film 39d with higher step coverage over the sacrificial film 23 and is preferable when the fixed portion 60 is curved in its cross-section as described above.

Then, the first insulation film 39d covering the sacrificial film 23, the protective film 25, and the sidewall 34 is formed as, for example, a TEOS-based oxide film.

Figure 9:
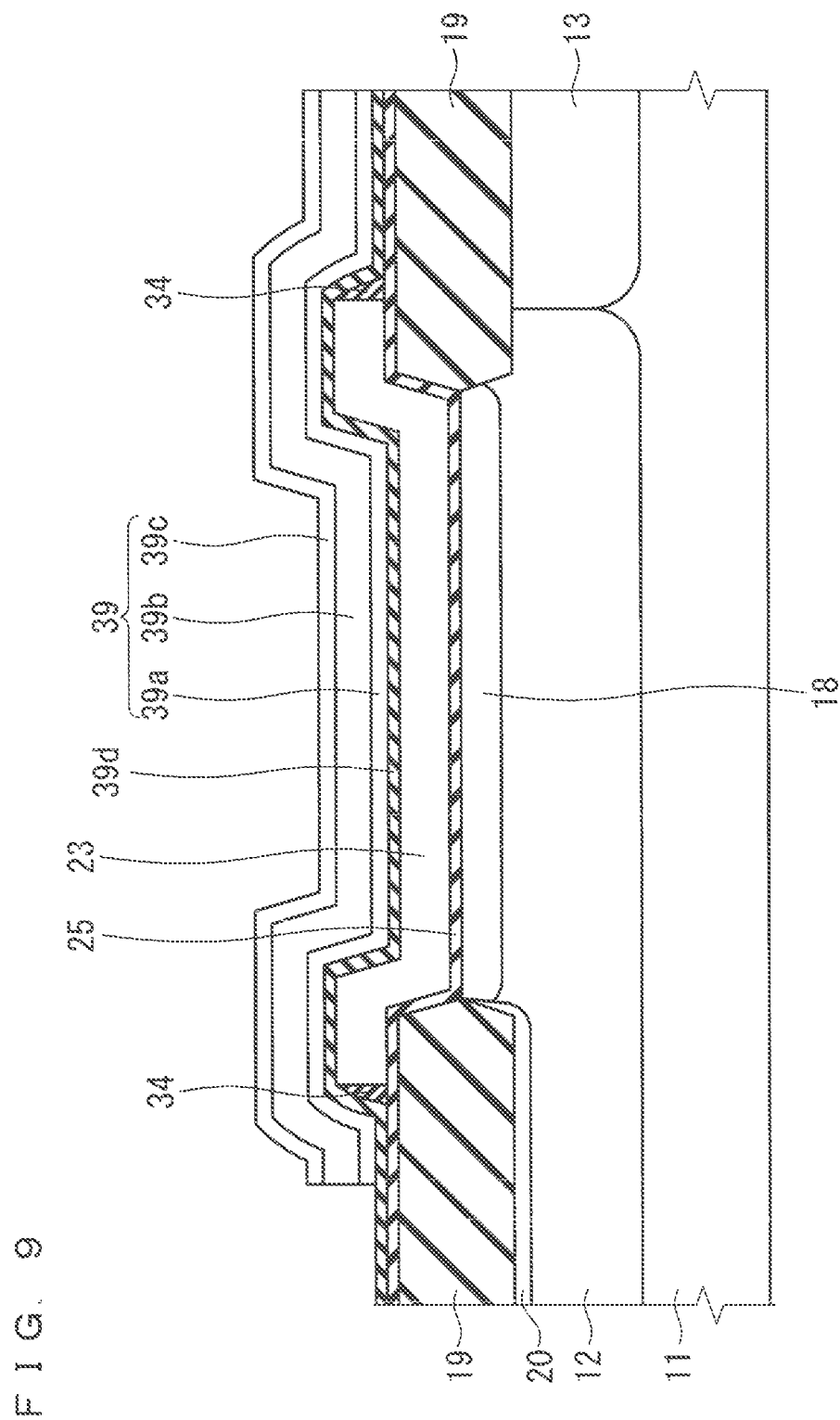

Next, FIG. 9 is referred to. The movable electrode 39 is formed on the first insulation film 39d. The movable electrode 39 has the aforementioned laminated structure. The first polysilicon layer 39a, the second polysilicon layer 39b, and the third polysilicon layer 39c are successively formed in this order, and are then shaped to form the movable electrode 39.

The first polysilicon layer 39a, the second polysilicon layer 39b, and the third polysilicon layer 39c each are formed by, for example, low-pressure CVD. It is known that the internal stresses in these polysilicon layers are controlled by the temperature when the layers are formed. For example, a temperature at which a polysilicon layer having a compressive stress is formed is set to 620° C., whereas a temperature at which a polysilicon layer having a tensile stress is formed is set to 580° C.

Since the movable electrode 39 requires conductivity, impurities are implanted into the first polysilicon layer 39a, the second polysilicon layer 39b, and the third polysilicon layer 39c during or immediately after the formation. The conductivity of the movable electrode 39 may be of n-type or p-type, depending on the impurities to be implanted. It is preferred to have the same conductivity in the first polysilicon layer 39a, the second polysilicon layer 39b, and the third polysilicon layer 39c in view of the conductivity of the movable electrode 39 as a whole.

The first polysilicon layer 39a, the second polysilicon layer 39b, and the third polysilicon layer 39c may have the same shape in a plan view. Embodiment 1 assumes that these layers have the same shape in a plan view. Thus, these layers can be shaped by single photolithography and a process. In other words, since the movable electrode 39 is formed without adding any complicated processes and the internal stresses in the movable electrode 39 can be simply controlled, increase in the number of processes is suppressed. This is preferable for suppressing increase in the costs.

Figure 10:
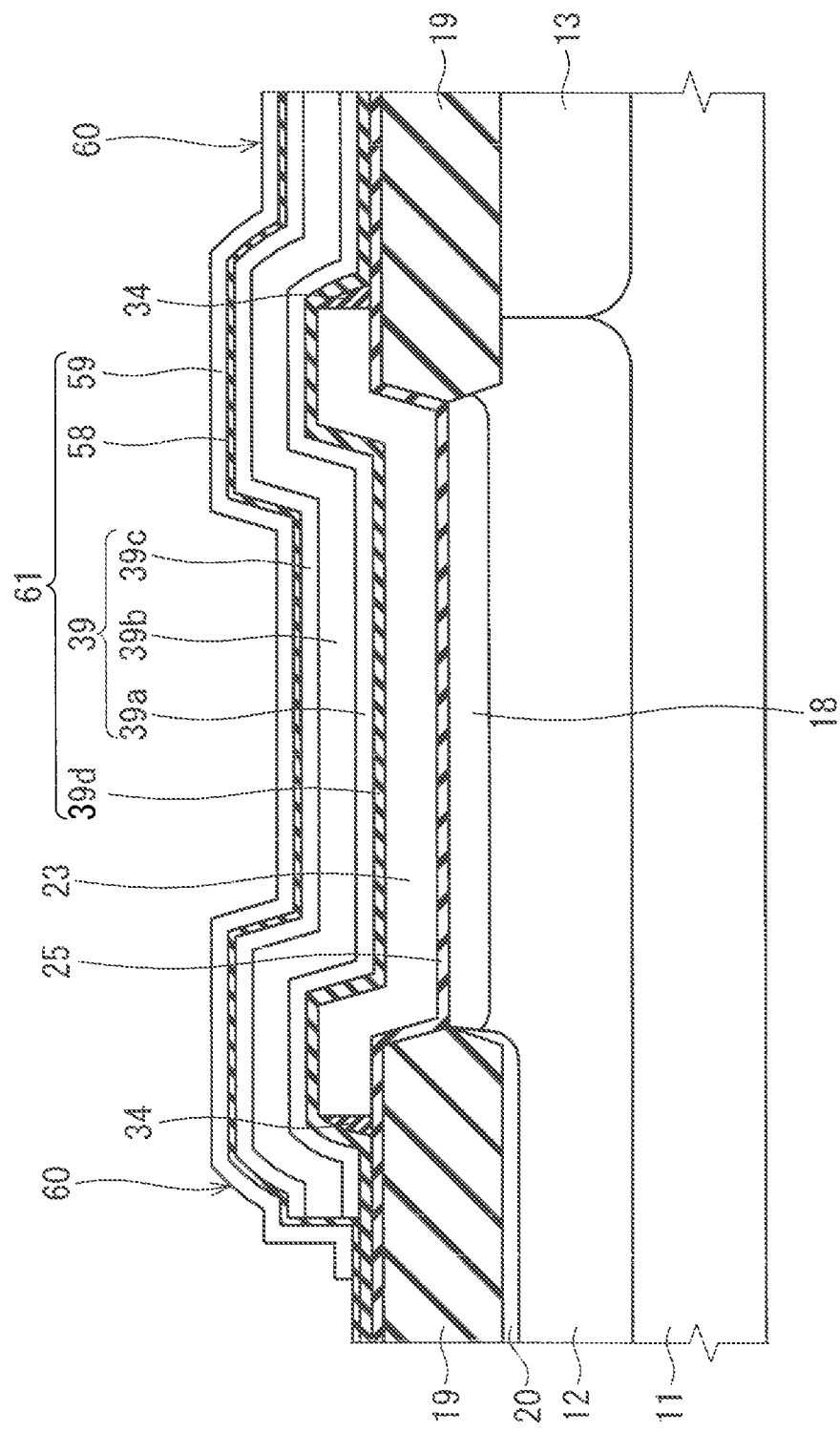
Figure 11:
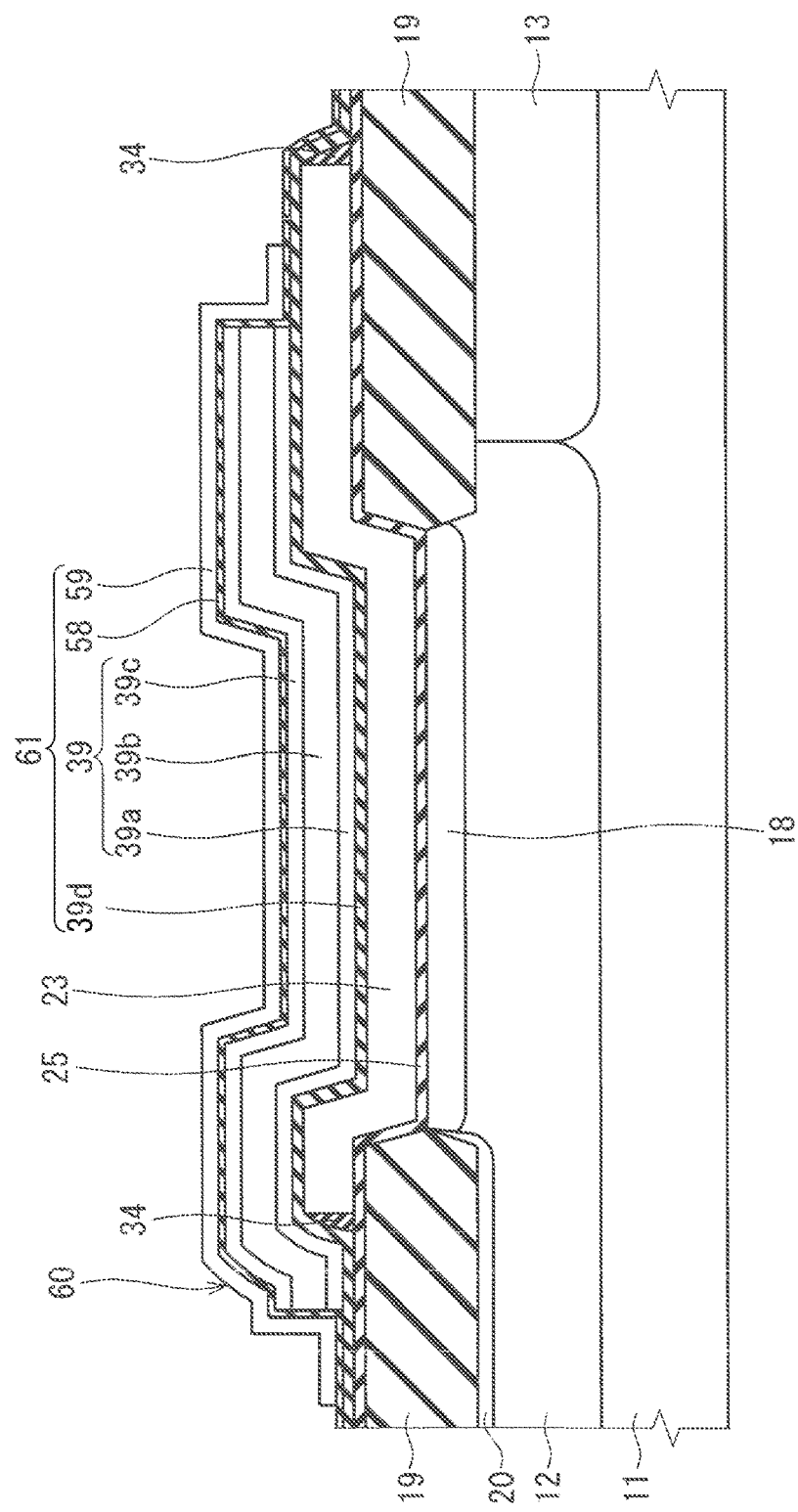

Next, FIGS. 10 and 11 are referred to. The second insulation film 58 and the shield film 59 that cover the movable electrode 39 are formed in this order. Both of these films can be formed by CVD. However, since the second insulation film 58 is of the same film type as that of the first insulation film 39d, the second insulation film 58 and the first insulation film 39d are formed under the same conditions. The relationship in thickness between these films is previously described.

Impurities are implanted into the shield film 59 during or immediately after the formation. The conductivity of the shield film 59 may be of n-type or p-type, depending on the impurities to be implanted. The shield film 59 is shaped by photolithography and an etching process. The diaphragm 61 has a film thickness of approximately 500 to 2000 nm.

Figure 12:
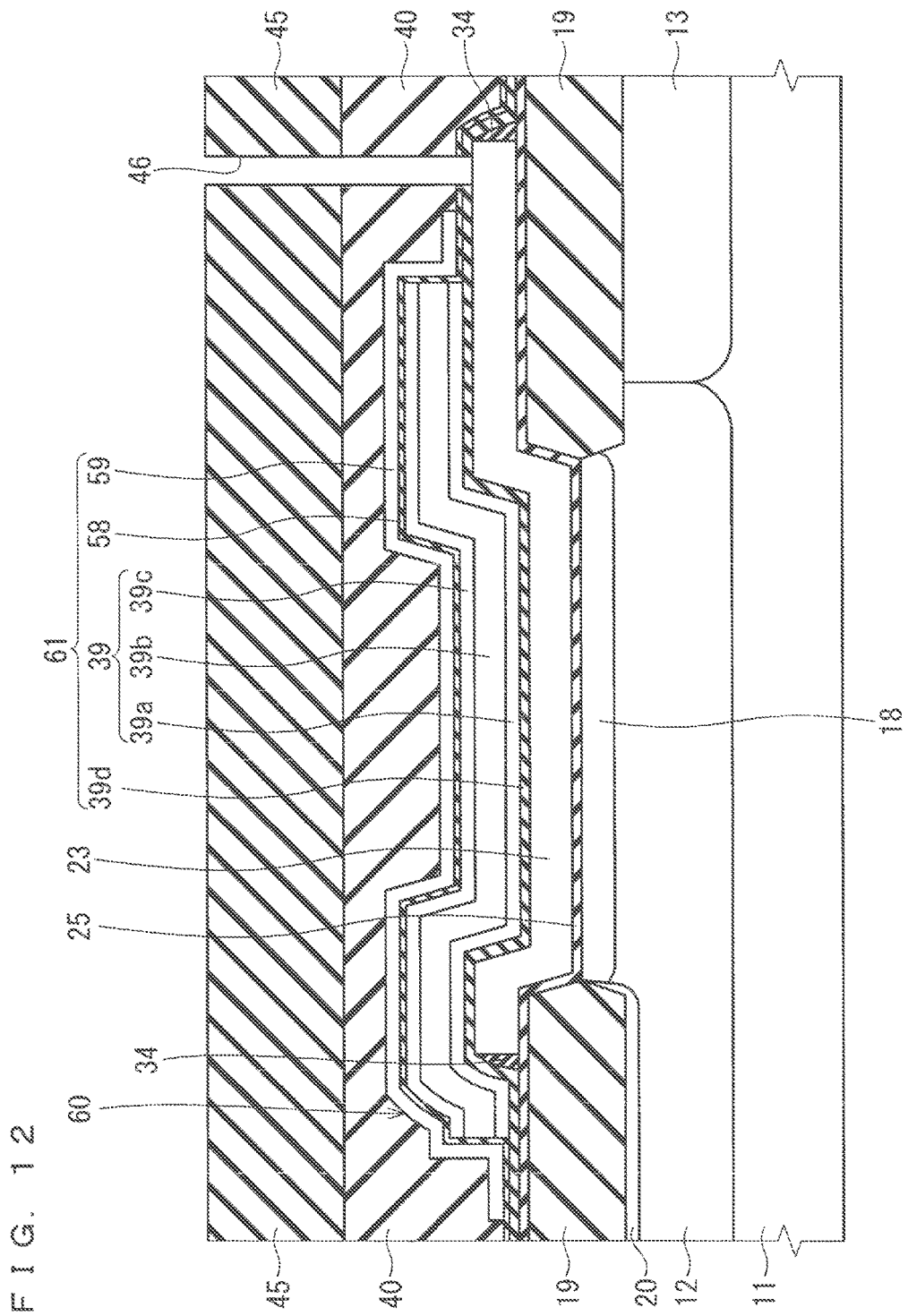

Next, FIG. 12 is referred to. The first interlayer insulation film 40 covering the diaphragm 61, the second insulation film 58, and the shield film 59 is formed. An aluminum line provided on the surface of the first interlayer insulation film 40, and a contact hole piercing therethrough in the thickness direction are formed by a known technique. The fixed electrode 18, the movable electrode 39, and the shield film 59 are connected to the aluminum line through the contact hole, whereby they are brought into conduction with an external device of the semiconductor pressure sensor 100A through the aluminum line. Since the technique for conduction is known by, for example, Patent Document 4, the illustration and the detailed description of the contact hole and the aluminum line will be omitted.

The second interlayer insulation film 45 covering the aluminum line (illustration omitted) and the first interlayer insulation film 40 is formed. The second interlayer insulation film 45 is formed of, for example, plasma-enhanced tetraethyl orthosilicate (PE-TEOS) glass. Then, with application of photolithography and an etching process, the etching hole 46 reaching the sacrificial film 23 at a position where the diaphragm 61 does not exist is opened by piercing through the first interlayer insulation film 40, the second interlayer insulation film 45, the second insulation film 58, and the first insulation film 39d. Here, a case where the etching hole 46 is placed at a position where the shield film 59 does not exist is exemplified.

An etching solution is charged into the etching hole 46. The etching solution is, for example, an etchant for etching polysilicon. Although the solution etches the sacrificial film 23, the first insulation film 39d and the protective film 25 are not significantly etched. Accordingly, the air gap 51 illustrated in FIGS. 1 and 2 is obtained.

Considering the influence of etching the sacrificial film 23 on the first insulation film 39d, it is preferred that the second insulation film 58 has the same thickness as that of the first insulation film 39d when the first insulation film 39d is formed after the etching as described above.

Figure 13:
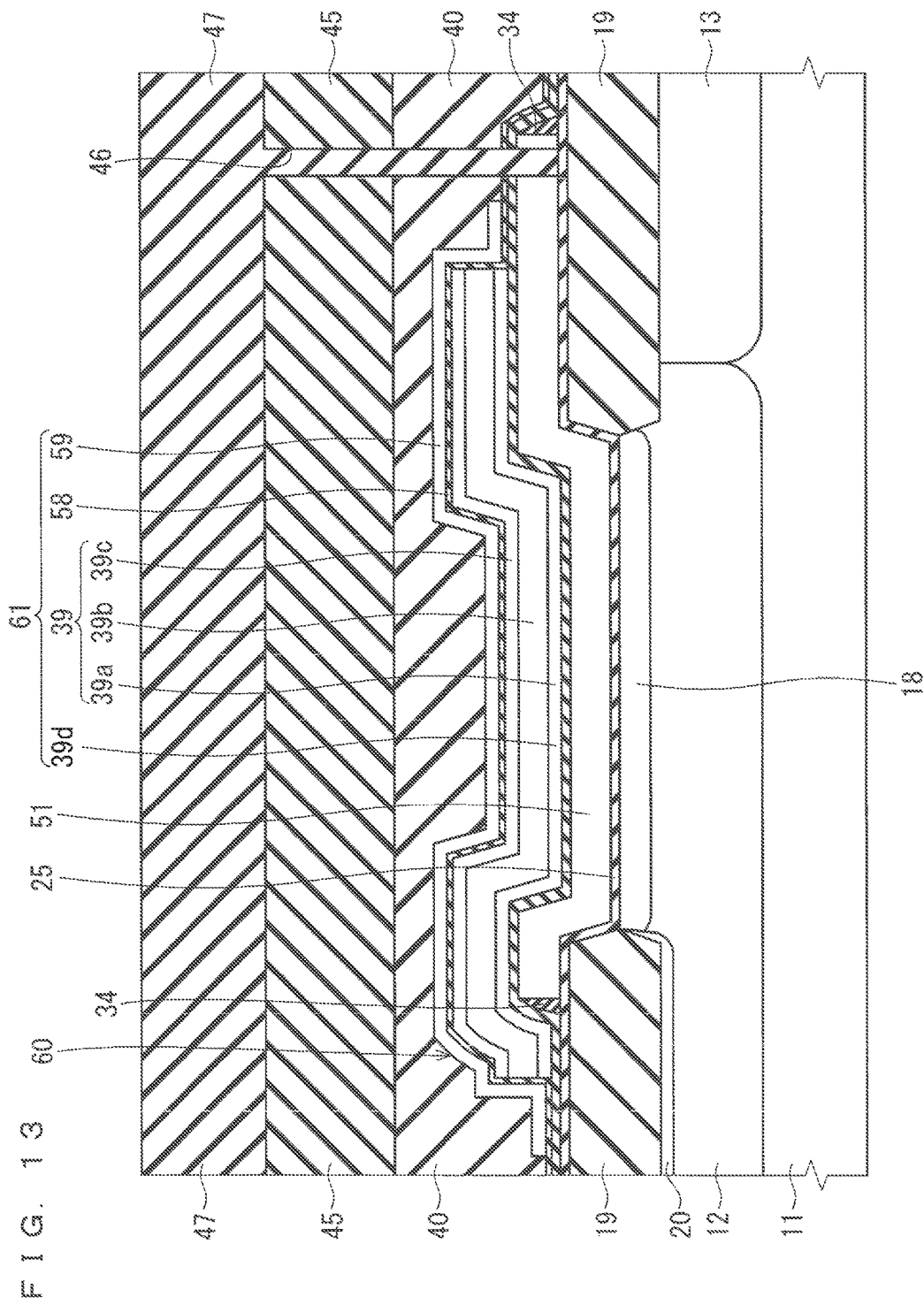

Next, FIG. 13 is referred to. The insulating sealing film 47 that covers the second interlayer insulation film 45 and seals the etching hole 46 is formed. Since the sealing film 47 is formed in a vacuum atmosphere, the air gap 51 becomes a vacuum chamber. Furthermore, the first interlayer insulation film 40, the second interlayer insulation film 45, and the sealing film 47 are shaped by a known technique to obtain the structure illustrated in FIGS. 1 and 2.

As described above, most of the processes of forming the semiconductor pressure sensor 100A can adopt a fine semiconductor process for forming MOS circuits. In addition, any additional thermal treatment for controlling the internal stresses in the diaphragm 61 is unnecessary. Each of the polysilicon layers are formed sufficiently at 560 to 750° C., thus indicating that the thermal treatment performed at a temperature higher than or equal to 900° C. as introduced by Patent Document 1 is unnecessary. Consequently, even when the semiconductor pressure sensor 100A is monolithically formed with a MOS circuit, the MOS circuit is not impaired. In other words, the semiconductor pressure sensor 100A is suitable for being monolithically integrated with a MOS circuit.

Embodiment 2

Figure 14:
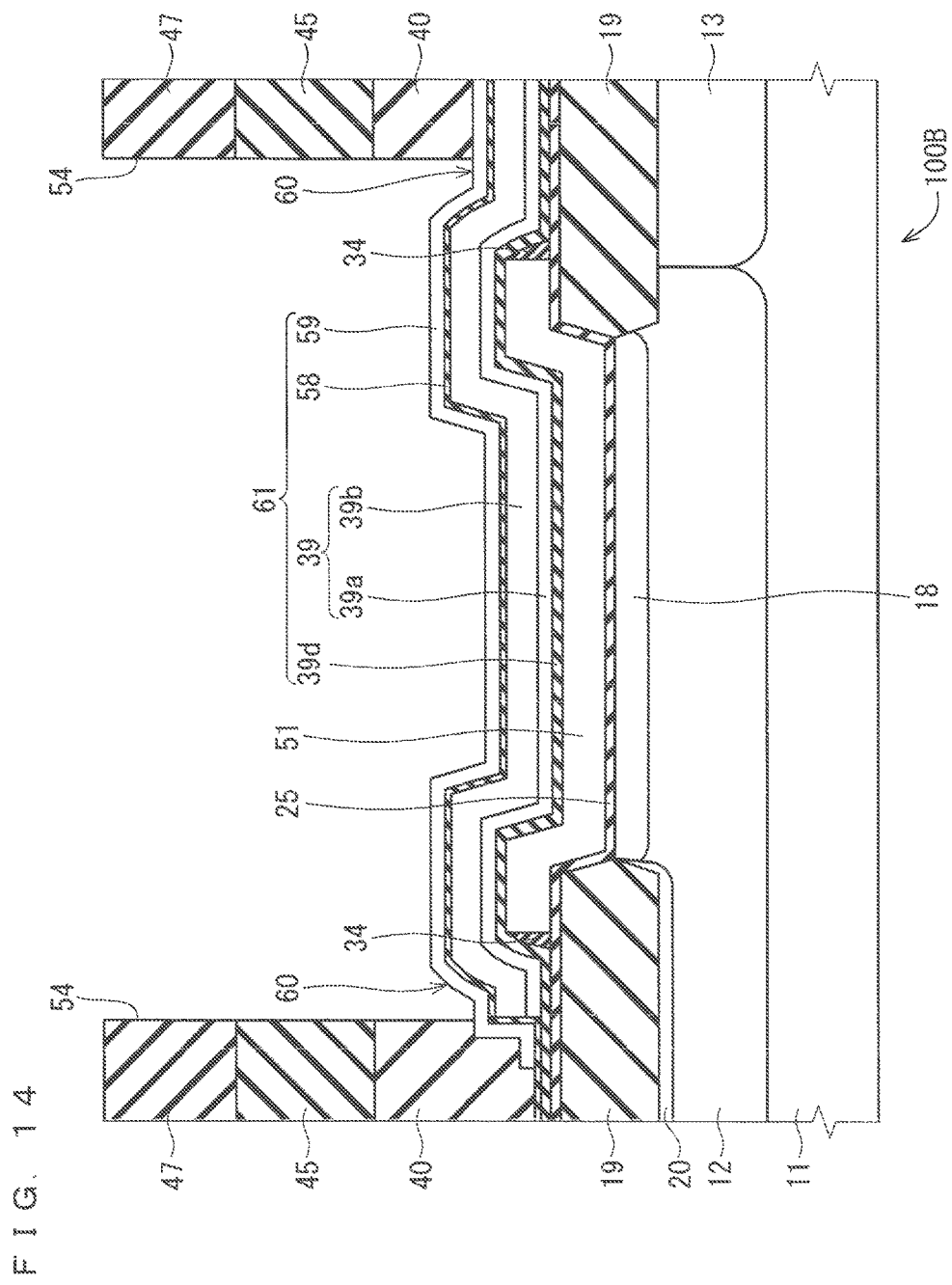
FIG. 14 is a cross-sectional view illustrating a structure of a semiconductor pressure sensor according to Embodiment 2.
Figure 15:
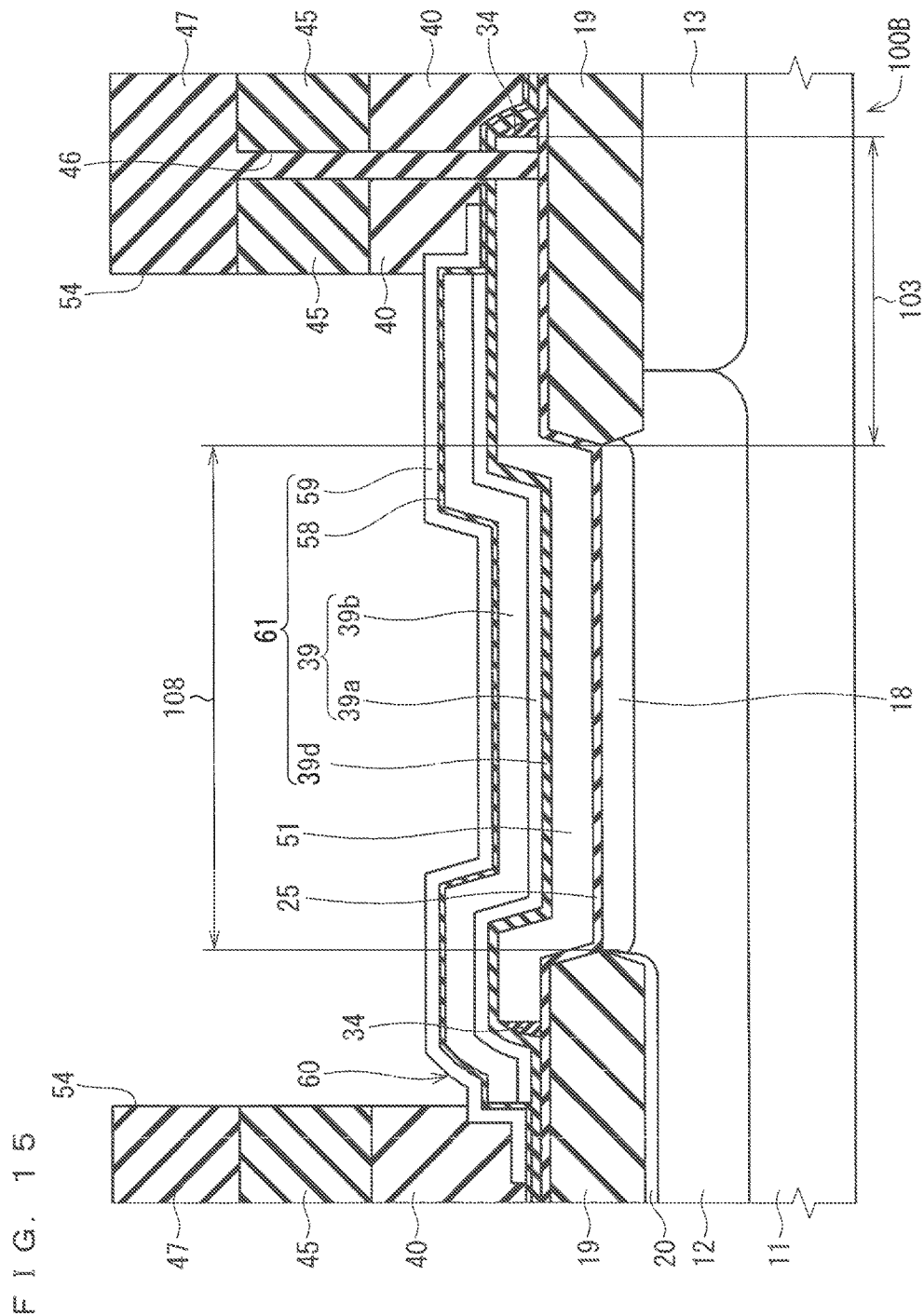
FIG. 15 is a cross-sectional view illustrating a structure of a semiconductor pressure sensor according to Embodiment 2.

FIGS. 14 and 15 are cross-sectional views each illustrating a structure of the semiconductor pressure sensor 100B according to Embodiment 2. FIG. 14 is a cross-sectional view corresponding to the line AA in FIG. 3, and FIG. 15 is a cross-sectional view corresponding to the lines BB in FIG. 3.

The semiconductor pressure sensor 100B differs only in laminated structure of the movable electrode 39 from the semiconductor pressure sensor 100A. Specifically, Embodiment 2 exemplifies a case where the movable electrode 39 of the semiconductor pressure sensor 100B includes the first polysilicon layer 39a and the second polysilicon layer 39b that are laminated in a thickness direction in a stated order from the fixed electrode 18. In other words, the semiconductor pressure sensor 100B has a structure in which the third polysilicon layer 39c is omitted from the semiconductor pressure sensor 100A.

In the semiconductor pressure sensor 100B, change in pressure applied to the diaphragm 61 changes the amount of deflection of the diaphragm 61 and a distance between the movable electrode 39 and the fixed electrode 18 similarly as the semiconductor pressure sensor 100A. Then, the change of the distance is detected as a change in the capacitance.

In the semiconductor pressure sensor 100B, it is assumed, for example, that the first polysilicon layer 39a and the shield film 59 have tensile internal stresses and the second polysilicon layer 39b has a compressive internal stress. Alternatively, it is assumed that the first polysilicon layer 39a and the shield film 59 have compressive internal stresses and the second polysilicon layer 39b has a tensile internal stress. As described in Embodiment 1, the stress in each of the layers can be controlled by, for example, controlling a temperature when the layer is formed.

In the semiconductor pressure sensor 100B, the first insulation film 39d is set to the same film type as that of the second insulation film 58 similarly as the semiconductor pressure sensor 100A. Accordingly, the stress gradient of the diaphragm 61 caused by differences in internal stress between the movable electrode 39 and the second insulation film 58 and between the shield film 59 and the second insulation film 58 is reduced. Furthermore, the dependence of displacement of the diaphragm 61 on a temperature that is caused by the differences in coefficient of linear thermal expansion between the movable electrode 39 and the second insulation film 58 and between the shield film 59 and the second insulation film 58 is reduced.

Particularly, the description in Embodiment 1 as to the point that it is preferred to match the thicknesses of the first insulation film 39d and the second insulation film 58 holds true for Embodiment 2.

The directions of the internal stresses are identical between the first polysilicon layer 39a and the shield film 59. Thus, the stress gradient of the diaphragm 61 is reduced.

Particularly, matching the type and the formation conditions between the first polysilicon layer 39a and the shield film 59 balances the stress gradient of the whole diaphragm 61. The matching is preferable in almost planarizing the diaphragm 61 with no load applied, that is, in almost eliminating the amount of deflection in the diaphragm 61 with no load applied.

When it is preferred to obtain the diaphragm 61 swelling toward the semiconductor substrate 11 with no load applied, a bending moment induced by the stress gradient of the diaphragm 61 is available. For example, when the first polysilicon layer 39a and the shield film 59 have tensile internal stresses, the first polysilicon layer 39a is preferably thicker than the shield film 59. For example, when the first polysilicon layer 39a and the shield film 59 have compressive internal stresses, the shield film 59 is preferably thicker than the first polysilicon layer 39a.

Not only the stress gradient but also the internal stresses can be reduced in the whole diaphragm 61. For example, when the internal stresses per unit thickness of the first polysilicon layer 39a, the second polysilicon layer 39b, and the shield film 59 are identical, equating a sum of the thicknesses of the first polysilicon layer 39a and the shield film 59 with a thickness of the second polysilicon layer 39b balances all the internal stresses of the whole diaphragm 61.

Thus, not only the reliability against causes of error including attraction of a charged material and moisture and the external noise but also the reliability against causes of error including the stress gradient of the diaphragm 61 and the dependence of displacement of the diaphragm 61 on a temperature are higher in the semiconductor pressure sensor 100B similarly as the semiconductor pressure sensor 100A.

Furthermore, the dependence of the displacement of the diaphragm 61 or the movable electrode 39 on the stress can be controlled by adjusting the thickness of each of the polysilicon layers.

Figure 16:
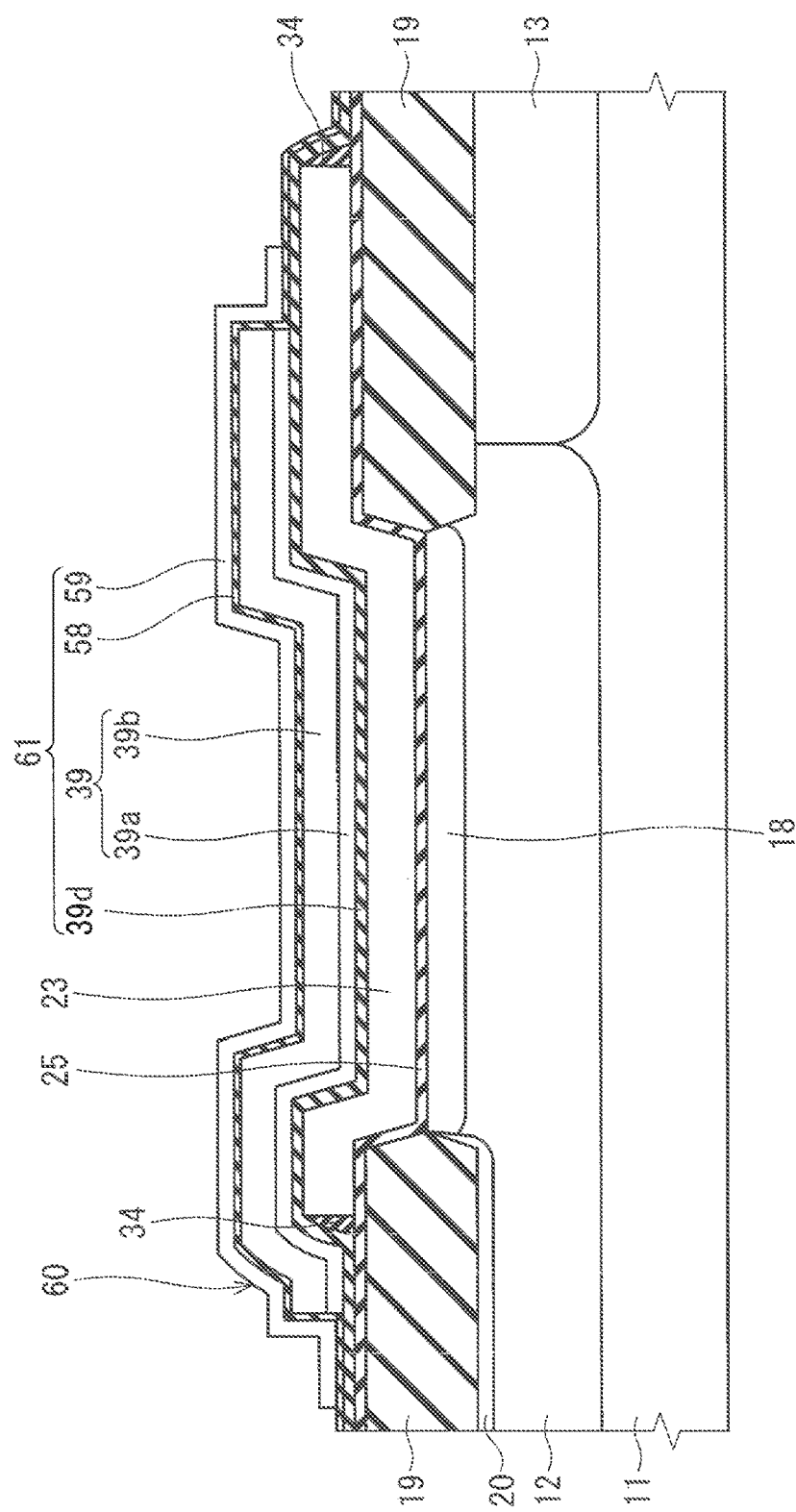
FIGS. 16 to 18 are cross-sectional views each describing a method for manufacturing a semiconductor pressure sensor according to Embodiment 2.
Figure 17:
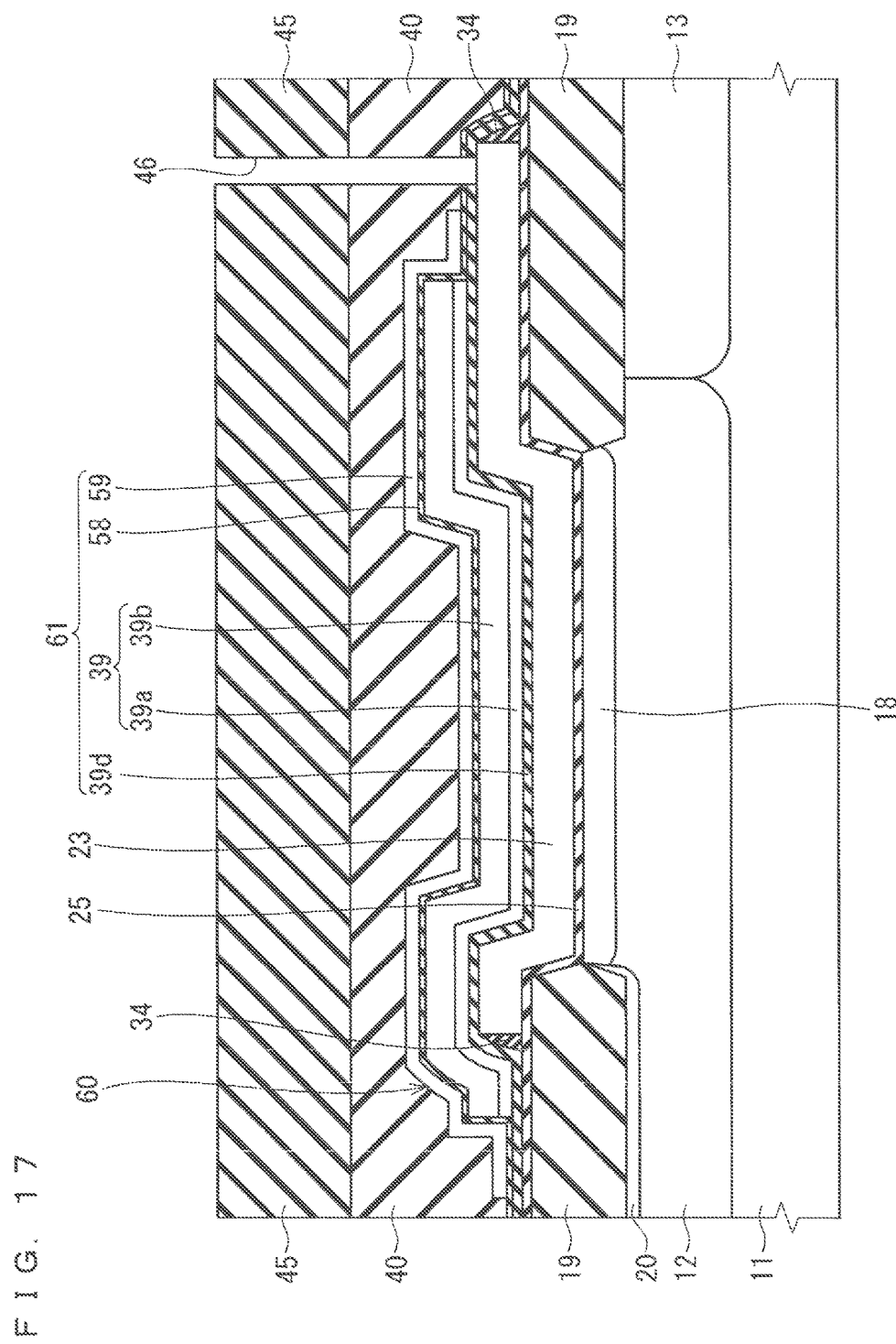
Figure 18:
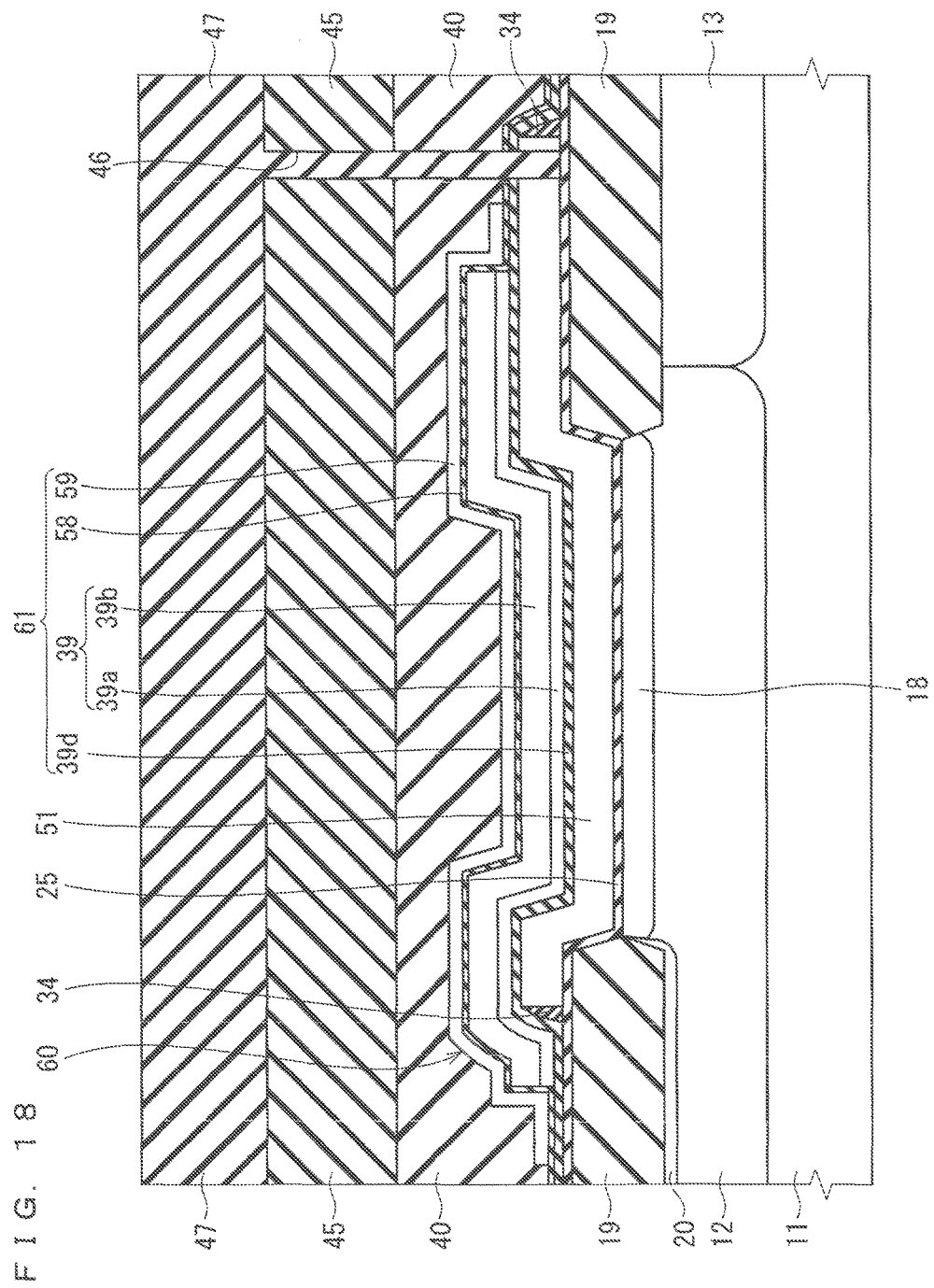

A method for manufacturing the semiconductor pressure sensor 100B will be described hereinafter with reference to FIG. 16 to 18. FIGS. 16 to 18 are cross-sectional views corresponding to the lines BB in FIG. 3. The manufacturing processes for the semiconductor pressure sensor 100A up to the process of forming the second polysilicon layer 39b are used for the semiconductor pressure sensor 100B.

With reference to FIG. 16, the first polysilicon layer 39a and the second polysilicon layer 39b are successively formed on the first insulation film 39d in this order, and are then shaped to form the movable electrode 39.

The first polysilicon layer 39a and the second polysilicon layer 39b are formed, for example, under the same forming conditions as those described in Embodiment 1.

The first polysilicon layer 39a and the second polysilicon layer 39b may have the same shape in a plan view. Embodiment 2 assumes that these layers have the same shape. Thus, these layers can be shaped by single photolithography and a process. In other words, since the movable electrode 39 is formed without adding any complicated processes and the internal stresses in the movable electrode 39 can be simply controlled as the semiconductor pressure sensor 100A, increase in the number of processes is suppressed. This is preferable for suppressing increase in the costs.

Next, the second insulation film 58 and the shield film 59 that cover the movable electrode 39 are formed in this order. These films are formed under the same forming conditions as those described in Embodiment 1. The shield film 59 is shaped by photolithography and an etching process. The diaphragm 61 has a film thickness of approximately 500 to 2000 nm.

Next, FIG. 17 is referred to. The first interlayer insulation film 40 covering the diaphragm 61, the second insulation film 58, and the shield film 59 is formed. Then, the second interlayer insulation film 45 covering the first interlayer insulation film 40 is formed. These films are formed under the same forming conditions as those described in Embodiment 1.

Similarly as according to Embodiment 1, the etching hole 46 is opened by piercing through the first interlayer insulation film 40, the second interlayer insulation film 45, the second insulation film 58, and the first insulation film 39d.

An etching solution is charged into the etching hole 46 to etch the sacrificial film 23, thus obtaining the air gap 51 as illustrated in FIGS. 14 and 15.

Next, FIG. 18 is referred to. The insulating sealing film 47 that covers the second interlayer insulation film 45 and seals the etching hole 46 is formed. Since the sealing film 47 is formed in a vacuum atmosphere, the air gap 51 becomes a vacuum chamber. Furthermore, the first interlayer insulation film 40, the second interlayer insulation film 45, and the sealing film 47 are shaped by a known technique to obtain the structure illustrated in FIGS. 14 and 15.

As described above, the processes of forming the semiconductor pressure sensor 100B are obtained by omitting the process of forming the third polysilicon layer 39c from the processes of forming the semiconductor pressure sensor 100A. Thus, the processes of forming the semiconductor pressure sensor 100B are more advantageous in less number of processes than those of the semiconductor pressure sensor 100A. Moreover, the semiconductor pressure sensor 100B is also suitable for being monolithically integrated with a MOS circuit as the semiconductor pressure sensor 100A.

Embodiment 3

Figure 20:
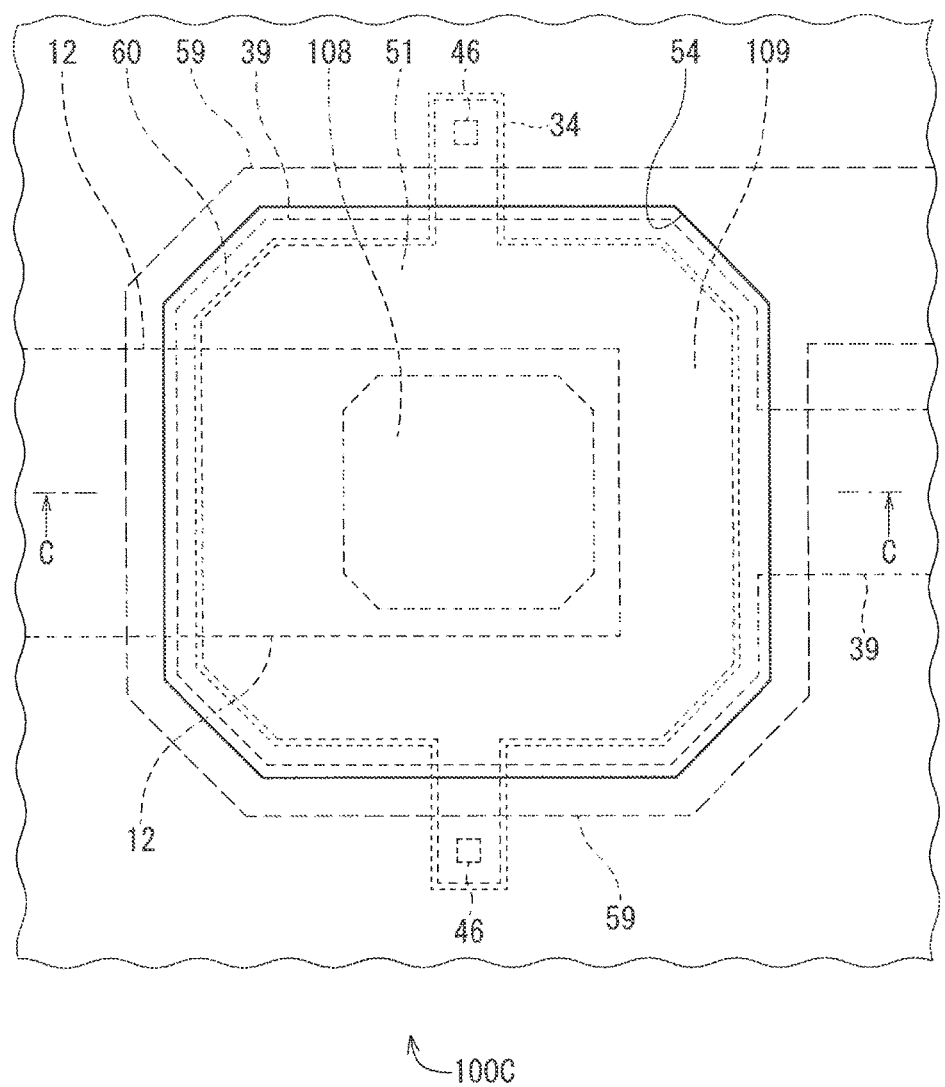
FIG. 20 is a plan view illustrating the structure of the semiconductor pressure sensor according to Embodiment 3.

FIG. 19 is a cross-sectional view illustrating a structure of a semiconductor pressure sensor 100C according to Embodiment 3. FIG. 20 is a plan view illustrating the structure of the semiconductor pressure sensor 100C. The line CC in FIG. 20 corresponds to the cross-section of FIG. 19.

The semiconductor pressure sensor 100C in FIG. 19 differs from the semiconductor pressure sensor 100A in FIG. 1 in wider area of the air gap 51 around the fixed electrode 18. In other words, FIG. 19 clearly illustrates that the air gap 51 is also placed between the insulation film 19 and the diaphragm 61 in the semiconductor pressure sensor 100C. In Embodiment 3 and the subsequent description, an area where the air gap 51 exists around the fixed electrode 18 in addition to the area 103 (see FIGS. 2 and 3) in the semiconductor pressure sensor 100A is regarded as an area 109.

In the area 109, the diaphragm 61 is also opposed to the insulation film 19 through the air gap 51 in a thickness direction and movable in the thickness direction also in an area where the diaphragm 61 is opposed to the insulation film 19. However, the capacitance between the movable electrode 39 and the fixed electrode 18 is hardly influenced by the deflection of the movable electrode 39 in the area 109.

On the other hand, the movable electrode 39 in the area 109 surrounds the movable electrode 39 in the area 108. Moreover, the opening 54 exposes not only the area 108 but also the area 109 excluding the proximity of the etching hole 46 (see, for example, FIGS. 2 and 15) to be sealed. Thus, the movable electrode 39 in the area 109 functions as a spring that increases the deflection of the movable electrode 39 in the area 108. The wider area 109 is preferable in view of the capacitance largely depending on the pressure to be applied to the semiconductor pressure sensor 100C, that is, in view of increasing the sensitivity and precision for detecting the pressure.

For example in the cross-section of FIG. 19, it is appropriate that the movable electrode 39 in the area 109 is approximately a half to three times as long as the movable electrode 39 in the area 108.

Although the semiconductor pressure sensor 100C is manufactured similarly as the semiconductor pressure sensor 100A, the shaped sacrificial film 23 (see FIGS. 8 to 12) is enlarged toward the insulation film 19 to enlarge the air gap 51.

FIG. 19 exemplifies that the semiconductor pressure sensor 100C has a three-layer structure of the first polysilicon layer 39a, the second polysilicon layer 39b, and the third polysilicon layer 39c as the movable electrode 39 similarly as the semiconductor pressure sensor 100A. The semiconductor pressure sensor 100C may have a two-layer structure of the first polysilicon layer 39a and the second polysilicon layer 39b as the movable electrode 39 similarly as the semiconductor pressure sensor 100B. The directions of stresses and the thicknesses of the first polysilicon layer 39a, the second polysilicon layer 39b, the third polysilicon layer 39c, the first insulation film 39d, the second insulation film 58, and the shield film 59 are preferably set in a similar manner as described in Embodiments 1 and 2.

Thus, not only the reliability against causes of error including attraction of a charged material and moisture and the external noise but also the reliability against causes of error including the stress gradient of the diaphragm 61 and the dependence of displacement of the diaphragm 61 on a temperature are higher in the semiconductor pressure sensor 100C similarly as the semiconductor pressure sensors 100A and 100B.

In the semiconductor pressure sensor 100C, the diaphragm 61 has shaped the fixed portion 60 that is fixed to the insulation film 19 from the opposite side of the semiconductor substrate 11. The sidewall 34 is placed above the insulation film 19, and a surface of the sidewall 34 that is adjacent to the fixed portion 60 is preferably a curve that is closer to the air gap 51 as it is more distant from the insulation film 19. The advantages of the characteristics of the semiconductor pressure sensor 100C are similar to those of the semiconductor pressure sensors 100A and 100B.

Embodiment 4

Figure 21:
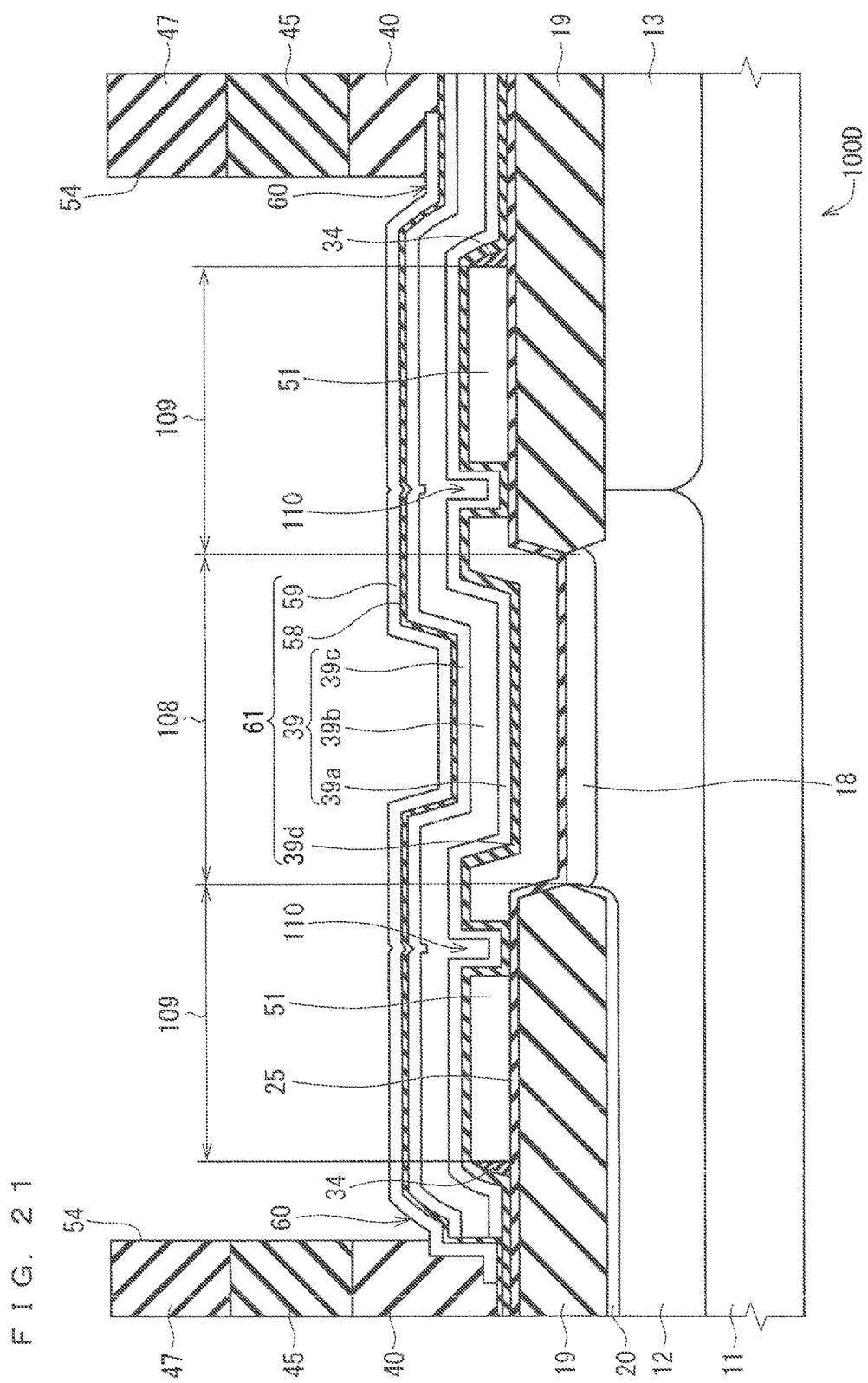
FIG. 21 is a cross-sectional view illustrating a structure of a semiconductor pressure sensor according to Embodiment 4.

FIG. 21 is a cross-sectional view illustrating a structure of a semiconductor pressure sensor 100D according to Embodiment 4. The cross-section of FIG. 21 corresponds to the cross-section of FIG. 19.

The semiconductor pressure sensor 100D differs from the semiconductor pressure sensor 100C in that the diaphragm 61 has shaped a fixed portion 110 in the area 109. The air gap 51 does not exist between the fixed portion 110 and the semiconductor substrate 11, and the first insulation film 39d is in contact with the protective film 25 at the fixed portion 110. The fixed portion 110 is, for example, ring-shaped to surround the area 108 or intermittently ring-shaped in a plan view.

Even when the area 109 is enlarged as in the semiconductor pressure sensor 100C, the fixed portion 110 prevents the movable electrode 39 in the area 109 from functioning as a spring for the movable electrode 39 in the area 108. In view of this, the fixed portion 110 is preferably placed closer to the area 108 in the area 109.

As such in the semiconductor pressure sensor 100D, the air gap 51 is also placed between the insulation film 19 and the diaphragm 61 and the diaphragm 61 is also opposed to the insulation film 19 through the air gap 51 in the thickness direction, similarly as in the semiconductor pressure sensor 100C. However, the diaphragm 61 is fixed in the thickness direction at the position opposed to the insulation film 19.

The semiconductor pressure sensor 100D is suitable as the reference of the semiconductor pressure sensor 100C. Since the fixed portion 110 is formed above the insulation film 19, it does not cause a difference in capacitance between the semiconductor pressure sensors 100C and 100D. Thus, among changes in capacitance of the semiconductor pressure sensor 100C with reference to the value of the capacitance of the semiconductor pressure sensor 100D, the changes subject to the manufacturing variability and factors other than changes in pressure are cancelled out. Thus, the pressure can be detected with higher precision using the differences in capacitance between the semiconductor pressure sensors 100C and 100D.

For such purposes, the semiconductor pressure sensor 100C is suitable for being monolithically integrated with a MOS circuit as well as the semiconductor pressure sensor 100D.

The semiconductor pressure sensor 100D can be manufactured similarly as the semiconductor pressure sensor 100C. However, the sacrificial film 23 (see FIGS. 8 to 12) above the insulation film 19 is annularly removed to provide the fixed portion 110.

The sacrificial film 23 is preferably made continuous between the areas 108 and 109 to etch the sacrificial film 23 from the area 109 to the area 108. Thus, the sacrificial film 23 is annularly removed preferably not completely but intermittently. Although the fixed portion 110 does not completely separate the area 108 from the area 109, it serves the purpose of causing the movable electrode 39 in the area 109 not to function as a spring for the movable electrode 39 in the area 108.

Embodiment 5

Figure 22:
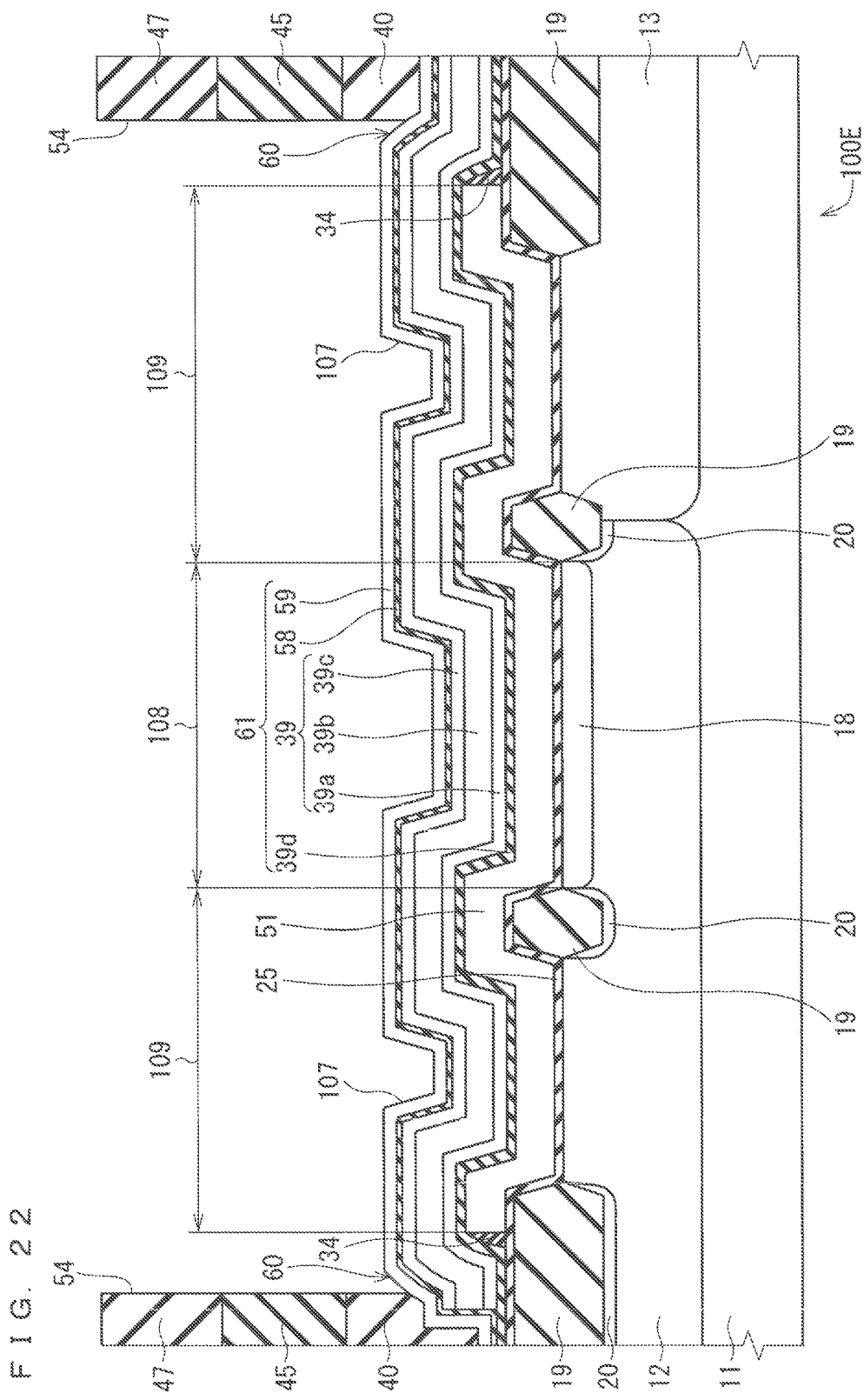
FIG. 22 is a cross-sectional view illustrating a structure of a semiconductor pressure sensor according to Embodiment 5.

FIG. 22 is a cross-sectional view illustrating a structure of a semiconductor pressure sensor 100E according to Embodiment 5. The cross-section of FIG. 22 corresponds to the cross-section of FIG. 19.

The semiconductor pressure sensor 100E in FIG. 22 differs from the semiconductor pressure sensor 100A in FIG. 1 in wider area of the air gap 51 around the fixed electrode 18. In other words, the air gap 51 in the semiconductor pressure sensor 100E is also placed between the diaphragm 61 and a surrounding principal surface that surrounds the fixed electrode 18 and is included in the principal surface of the semiconductor substrate 11. The surrounding principal surface can be recognized as the principal surface of the semiconductor substrate 11 in the area 109.

The air gap 51 is meandering in the thickness direction around the fixed electrode 18 or in the area 109 herein. The diaphragm 61 is movable in the thickness direction also at the position opposed to the area 109.

In Embodiment 5, an area where the air gap 51 exists around the fixed electrode 18 is also regarded as the area 109. Embodiment 5 differs from Embodiment 4 in that the area 109 includes not only an area where the insulation film 19 is formed but also an area where neither the fixed electrode 18 nor the insulation film 19 is formed. Specifically, the area 109 to the left of FIG. 22 includes the insulation film 19 and the first well area 12 above the principal surface of the semiconductor substrate 11. The area 109 to the right of FIG. 22 includes the insulation film 19 and the second well area 13 at the principal surface of the semiconductor substrate 11.

The diffusion layer 20 is placed on the first well area 12 and under the insulation film 19, that is, at the opposite side of the air gap 51. The diffusion layer 20 is separated by the insulation film 19 from the movable electrode 39 more than the air gap 51. Thus, the diffusion layer 20 does not function as a fixed electrode by itself but merely functions as a diffused lead connected from the fixed electrode 18.

The insulation film 19 also has a function of determining the position of the air gap 51 in the thickness direction as described with reference to FIGS. 8 to 18 in Embodiment 1. Specifically, the sacrificial film 23 is formed more distant from the semiconductor substrate 11 in the area including the insulation film 19 than that in the area excluding the insulation film 19. In other words, the air gap 51 is formed more distant from the semiconductor substrate 11 in the area including the insulation film 19 than that in the area excluding the insulation film 19.

In Embodiment 5, since the insulation films 19 are formed in the area 109 at the ends closer to the area 108 and at the ends farther from the area 108, the air gap 51 in the area 109 is meandering in the thickness direction. For example, the diaphragm 61 in the area 109 is also meandering in the thickness direction. Specifically, the diaphragm 61 has a recess 107 at the opposite side of the semiconductor substrate 11 in the area 109.

Furthermore, the opening 54 exposes not only the area 108 but also the area 109 excluding the proximity of the etching hole 46 (see, for example, FIGS. 2 and 15) to be sealed. Thus, the movable electrode 39 in the area 109 functions as a spring that increases the deflection of the movable electrode 39 in the area 108. It is preferred that the air gap 51 is meandering in the thickness direction in the area 109 in view of the capacitance largely depending on the pressure to be applied to the semiconductor pressure sensor 100E, that is, in view of increasing the sensitivity and precision for detecting the pressure.

Although the semiconductor pressure sensor 100E is manufactured similarly as the semiconductor pressure sensor 100C, the insulation film 19 is also formed around the area 108 so that the air gap 51 is meandering.

FIG. 22 exemplifies that the semiconductor pressure sensor 100E has a three-layer structure of the first polysilicon layer 39a, the second polysilicon layer 39b, and the third polysilicon layer 39c as the movable electrode 39 similarly as the semiconductor pressure sensor 100A. The semiconductor pressure sensor 100E may have a two-layer structure of the first polysilicon layer 39a and the second polysilicon layer 39b as the movable electrode 39 similarly as the semiconductor pressure sensor 100B. The directions of stresses and the thicknesses of the first polysilicon layer 39a, the second polysilicon layer 39b, the third polysilicon layer 39c, the first insulation film 39d, the second insulation film 58, and the shield film 59 are preferably set in a similar manner as described in Embodiments 1 and 2.

Thus, not only the reliability against causes of error including attraction of a charged material and moisture and the external noise but also the reliability against causes of error including the stress gradient of the diaphragm 61 and the dependence of displacement of the diaphragm 61 on a temperature are higher in the semiconductor pressure sensor 100E similarly as the semiconductor pressure sensors 100A and 100B.

In the semiconductor pressure sensor 100E, the diaphragm 61 has, at its ends in the cross-sectional view, the fixed portion 60 that is fixed to the insulation film 19 from the opposite side of the semiconductor substrate 11. The sidewall 34 is placed above the insulation film 19, and a surface of the sidewall 34 that is adjacent to the fixed portion 60 is preferably a curve that is closer to the air gap 51 as it is more distant from the insulation film 19. The advantages of the characteristics of the semiconductor pressure sensor 100E are similar to those of the semiconductor pressure sensors 100A and 100B.

Embodiment 6

Figure 23:
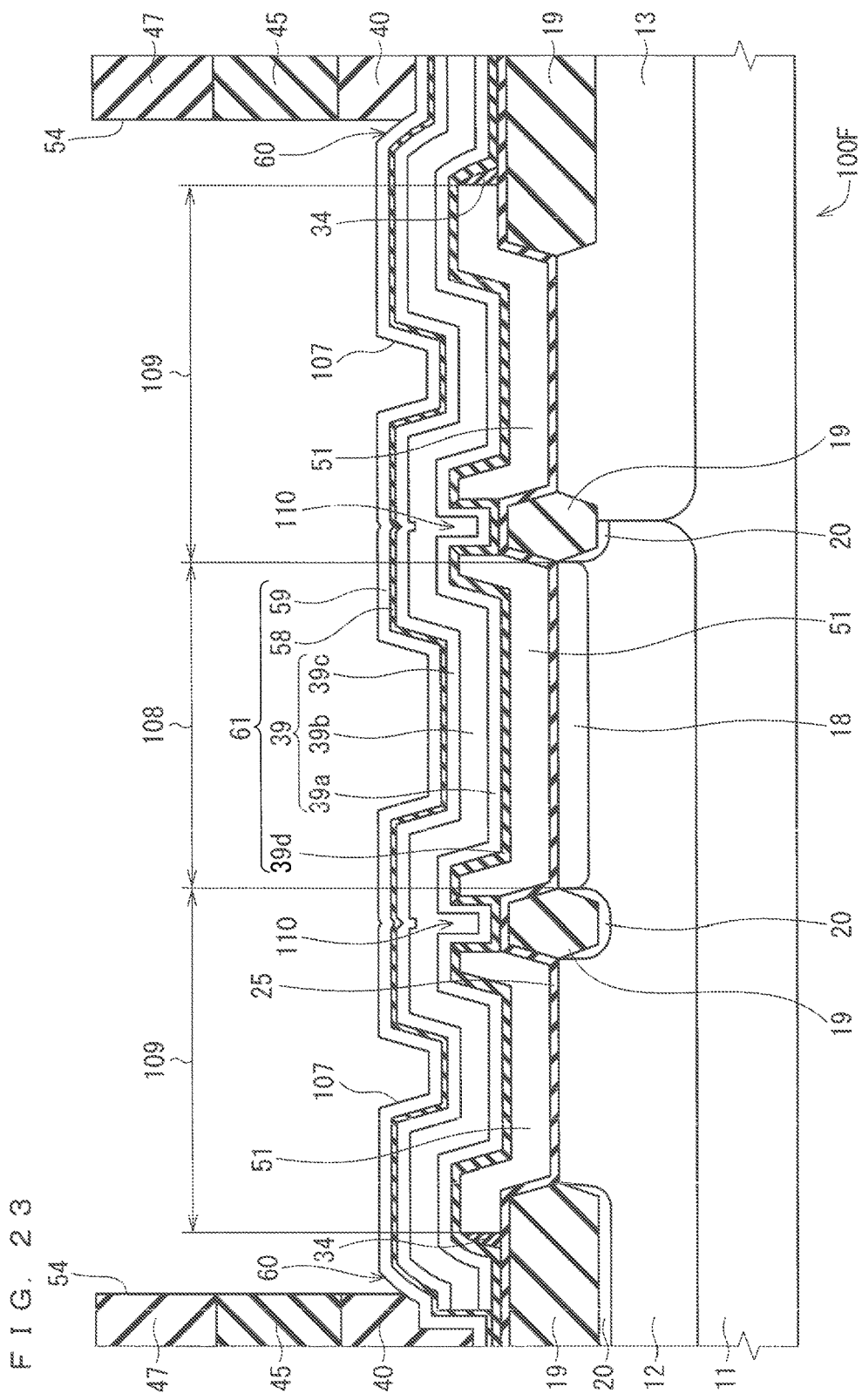
FIG. 23 is a cross-sectional view illustrating a structure of a semiconductor pressure sensor according to Embodiment 6.

FIG. 23 is a cross-sectional view illustrating a structure of a semiconductor pressure sensor 100F according to Embodiment 6. The cross-section of FIG. 23 corresponds to the cross-section of FIG. 19.

The semiconductor pressure sensor 100F differs from the semiconductor pressure sensor 100E in that the diaphragm 61 has shaped the fixed portion 110 in the area 109. The air gap 51 does not exist between the fixed portion 110 and the semiconductor substrate 11, and the first insulation film 39d is in contact with the protective film 25 at the fixed portion 110.

Even when the area 109 is enlarged as in the semiconductor pressure sensor 100E, the fixed portion 110 prevents the movable electrode 39 in the area 109 from functioning as a spring for the movable electrode 39 in the area 108. In view of this, the fixed portion 110 is preferably placed closer to the area 108 in the area 109. The fixed portion 110 is placed, for example, at a position of the insulation film 19 in a plan view.

As such in the semiconductor pressure sensor 100F, the air gap 51 is also placed between the insulation film 19 and the diaphragm 61 and the diaphragm 61 is also opposed to the insulation film 19 through the air gap 51 in the thickness direction in the area 109, as in the semiconductor pressure sensor 100E. However, the diaphragm 61 is fixed in the thickness direction at the position opposed to the insulation film 19.

The semiconductor pressure sensor 100F is suitable as the reference of the semiconductor pressure sensor 100E. Since the fixed portion 110 is formed above the insulation film 19, it does not cause a difference in capacitance between the semiconductor pressure sensors 100E and 100F. Thus, among changes in capacitance of the semiconductor pressure sensor 100E with reference to the value of the capacitance of the semiconductor pressure sensor 100F, the changes subject to the manufacturing variability and factors other than changes in pressure are cancelled out. Thus, the pressure can be detected with higher precision using the differences in capacitance between the semiconductor pressure sensors 100E and 100F.

For such purposes, the semiconductor pressure sensor 100E is suitable for being monolithically integrated with a MOS circuit as well as the semiconductor pressure sensor 100F.

The semiconductor pressure sensor 100F can be manufactured similarly as the semiconductor pressure sensor 100E. The sacrificial film 23 (see FIGS. 8 to 12) above the insulation film 19 is annularly removed to provide the fixed portion 110. Thus, the sacrificial film 23 is annularly removed preferably not completely but intermittently similarly as the semiconductor pressure sensor 100D.

Within the scope of the present invention, Embodiments can be freely combined, and any constituent elements of each of Embodiments can be appropriately modified or omitted.

Although Embodiments describe, for example, the materials of each of the constituent elements and conditions for implementation, they are exemplifications and not restrictive.

What is claimed is:

1. A semiconductor pressure sensor, comprising:
a fixed electrode placed at a principal surface of a semiconductor substrate; and
a diaphragm movable through an air gap in a thickness direction of said semiconductor substrate at least in an area where said diaphragm is opposed to said fixed electrode,
said diaphragm including:
a movable electrode;
a first insulation film placed closer to said air gap with respect to said movable electrode;
a second insulation film placed opposite to said air gap with respect to said movable electrode, said second insulation film being of a same film type as said first insulation film; and
a shield film that sandwiches said second insulation film with said movable electrode, wherein
said movable electrode includes a first polysilicon layer having a compressive internal stress, a second polysilicon layer having a tensile internal stress, and a third polysilicon layer having a compressive internal stress, said first polysilicon layer, said second polysilicon layer, and said third polysilicon layer being laminated in said thickness direction in a stated order from said fixed electrode, and
said shield film is a fourth polysilicon layer having a compressive internal stress.

2. The semiconductor pressure sensor according to claim 1, further comprising
a third insulation film surrounding said fixed electrode at said principal surface of said semiconductor substrate,
wherein said diaphragm has, at ends of said diaphragm in a cross-section, a fixed portion that is fixed to said third insulation film from an opposite side of said semiconductor substrate.

3. The semiconductor pressure sensor according to claim 1,
wherein said air gap is placed between said diaphragm and a principal surface surrounding said fixed electrode, said surrounding principal surface being included in said principal surface of said semiconductor substrate,
said air gap is meandering in said thickness direction at least around said fixed electrode, and
said diaphragm is movable in said thickness direction in an area where said diaphragm is opposed to said surrounding principal surface.

4. A semiconductor pressure sensor, comprising:
a fixed electrode placed at a principal surface of a semiconductor substrate; and
a diaphragm movable through an air gap in a thickness direction of said semiconductor substrate at least in an area where said diaphragm is opposed to said fixed electrode,
said diaphragm including:
a movable electrode;
a first insulation film placed closer to said air gap with respect to said movable electrode;
a second insulation film placed opposite to said air gap with respect to said movable electrode, said second insulation film being of a same film type as said first insulation film; and
a shield film that sandwiches said second insulation film with said movable electrode, wherein
said movable electrode includes a first polysilicon layer having a compressive internal stress and a second polysilicon layer having a tensile internal stress, said first polysilicon layer and said second polysilicon layer being laminated in said thickness direction in a stated order from said fixed electrode, and
said shield film is a fourth polysilicon layer having a compressive internal stress.

5. The semiconductor pressure sensor according to claim 4, further comprising
a third insulation film surrounding said fixed electrode at said principal surface of said semiconductor substrate,
wherein said diaphragm has, at ends of said diaphragm in a cross-section, a fixed portion that is fixed to said third insulation film from an opposite side of said semiconductor substrate.

6. The semiconductor pressure sensor according to claim 4,
wherein said air gap is placed between said diaphragm and a principal surface surrounding said fixed electrode, said surrounding principal surface being included in said principal surface of said semiconductor substrate,
said air gap is meandering in said thickness direction at least around said fixed electrode, and
said diaphragm is movable in said thickness direction in an area where said diaphragm is opposed to said surrounding principal surface.

* * * * *